(12) United States Patent
Kimura

(10) Patent No.: US 10,228,243 B2
(45) Date of Patent: Mar. 12, 2019

(54) DISTANCE SENSOR WITH PARALLEL PROJECTION BEAMS

(71) Applicant: Magik Eye Inc., New York, NY (US)

(72) Inventor: Akiteru Kimura, Tokyo (JP)

(73) Assignee: MAGIK EYE INC., New York, NY (US)

( * ) Notice: Subject to any disclaimer, the term of this patent is extended or adjusted under 35 U.S.C. 154(b) by 172 days.

(21) Appl. No.: 15/149,323

(22) Filed: May 9, 2016

(65) Prior Publication Data

US 2016/0327385 A1   Nov. 10, 2016

Related U.S. Application Data

(60) Provisional application No. 62/159,286, filed on May 10, 2015.

(51) Int. Cl.

| | |
|---|---|
| *G01B 11/14* | (2006.01) |
| *G01C 3/08* | (2006.01) |
| *F21V 5/00* | (2018.01) |
| *F21V 8/00* | (2006.01) |
| *G02B 6/34* | (2006.01) |
| *G06K 9/00* | (2006.01) |

(Continued)

(52) U.S. Cl.
CPC ............... *G01C 3/08* (2013.01); *F21V 5/008* (2013.01); *G02B 6/0005* (2013.01); *G02B 6/34* (2013.01); *G06K 9/00805* (2013.01); *H01S 5/423* (2013.01); *H04N 5/23238* (2013.01); *G02B 27/425* (2013.01); *G06T 2207/10052* (2013.01); *G06T 2207/30261* (2013.01); *H04N 5/2256* (2013.01)

(58) Field of Classification Search
CPC ........... G06T 2207/10028; F21V 5/008; G01B 11/026; G02B 27/425; H04N 9/3161
See application file for complete search history.

(56) References Cited

U.S. PATENT DOCUMENTS

| | | |
|---|---|---|
| 4,914,460 A | 4/1990 | Caimi et al. |
| 5,598,299 A | 1/1997 | Hayakawa |

(Continued)

FOREIGN PATENT DOCUMENTS

WO   WO 2014-131064   8/2014

OTHER PUBLICATIONS

International Preliminary Report on Patentability, dated Nov. 23, 2017 in corresponding PCT Application No. PCT/US2016/031412, 10 pages.

(Continued)

*Primary Examiner* — Alison Slater
(74) *Attorney, Agent, or Firm* — Tong, Rea, Bentley & Kim, LLC

(57) ABSTRACT

A method for calculating a distance to an object includes projecting a plurality of projection beams from each of a plurality of projection points, wherein the plurality of projection points is arranged around a lens of an image capturing device, and wherein at least two beams of the plurality of projection beams are parallel to each other, capturing an image of the field of view, wherein the object is visible in the image and a projection pattern generated by the at least two beams of the plurality of projection beams is also visible in the image, and calculating the distance to the object using information in the image.

19 Claims, 20 Drawing Sheets

(51) Int. Cl.
    *H04N 5/232* (2006.01)
    *H01S 5/42* (2006.01)
    *H04N 5/225* (2006.01)
    *G02B 27/42* (2006.01)

(56) References Cited

U.S. PATENT DOCUMENTS

| | | |
|---|---|---|
| 5,730,702 A | 3/1998 | Tanaka et al. |
| 5,980,454 A | 11/1999 | Broome |
| 2003/0071891 A1 | 4/2003 | Geng |
| 2006/0055942 A1 | 3/2006 | Krattiger |
| 2006/0290781 A1 | 12/2006 | Hama |
| 2007/0091174 A1 | 4/2007 | Kochi et al. |
| 2007/0206099 A1 | 9/2007 | Matsuo et al. |
| 2008/0128506 A1 | 6/2008 | Tsikos |
| 2010/0149315 A1 | 6/2010 | Qu et al. |
| 2010/0238416 A1 | 9/2010 | Kuwata |
| 2012/0113252 A1 | 5/2012 | Yang et al. |
| 2012/0225718 A1 | 9/2012 | Zhang |
| 2014/0009571 A1 | 1/2014 | Geng |
| 2014/0036096 A1 | 2/2014 | Sterngren |
| 2014/0071239 A1 | 3/2014 | Yokota |
| 2014/0125813 A1* | 5/2014 | Holz .................. G06K 9/00375 348/169 |
| 2014/0207326 A1* | 7/2014 | Murphy ............... G05D 1/0236 701/28 |
| 2014/0275986 A1 | 9/2014 | Vertikov |
| 2014/0320605 A1* | 10/2014 | Johnson ............. G01B 11/2513 348/47 |
| 2015/0009301 A1* | 1/2015 | Ribnick ............... G01B 11/303 348/50 |
| 2015/0077764 A1 | 3/2015 | Braker |
| 2015/0171236 A1* | 6/2015 | Murray ............. H01L 31/02325 250/208.1 |
| 2015/0248796 A1* | 9/2015 | Iyer .................... G07C 9/00007 340/5.61 |
| 2015/0268399 A1 | 9/2015 | Futterer |
| 2016/0022374 A1 | 1/2016 | Haider |
| 2016/0128553 A1 | 5/2016 | Geng |
| 2016/0178915 A1 | 6/2016 | Mor et al. |
| 2016/0267682 A1 | 9/2016 | Yamashita |
| 2016/0327385 A1 | 11/2016 | Kimura |
| 2016/0334939 A1* | 11/2016 | Dawson ................ G06F 3/0425 |
| 2016/0350594 A1* | 12/2016 | McDonald ......... G06K 9/00604 |
| 2017/0307544 A1 | 10/2017 | Nagata |

OTHER PUBLICATIONS

Search Report mailed in corresponding EP Patent Application No. 16 793 300.1, dated Oct. 22, 2018, 6 pages.

* cited by examiner

DISTANCE SENSOR WITH PARALLEL PROJECTION BEAMS

CROSS REFERENCE TO RELATED APPLICATIONS

This application claims the benefit of U.S. Provisional Patent Application Ser. No. 62/159,286, filed May 10, 2015, which is herein incorporated by reference in its entirety.

FIELD OF THE DISCLOSURE

The present disclosure relates generally computer vision systems and relates more particularly to sensors for measuring the distance between a vehicle and an object or point in space.

Unmanned vehicles, such as robotic vehicles and drones, typically rely on computer vision systems for obstacle detection and navigation in the surrounding environment. These computer vision systems, in turn, typically rely on various sensors that acquire visual data from the surrounding environment, which the computer vision systems process in order to gather information about the surrounding environment. For instance, data acquired via one or more imaging sensors may be used to determine the distance from the vehicle to a particular object or point in the surrounding environment.

SUMMARY

In one embodiment, a method for calculating a distance to an object includes projecting a plurality of projection beams from each of a plurality of projection points, wherein the plurality of projection points is arranged around a lens of an image capturing device, and wherein at least two beams of the plurality of projection beams are parallel to each other, capturing an image of the field of view, wherein the object is visible in the image and a projection pattern generated by the at least two beams of the plurality of projection beams is also visible in the image, and calculating the distance to the object using information in the image.

In another embodiment, a computer-readable storage device stores a plurality of instructions which, when executed by a processor, cause the processor to perform operations for calculating a distance to an object. The operations include projecting a plurality of projection beams from each of a plurality of projection points, wherein the plurality of projection points is arranged around a lens of an image capturing device, and wherein at least two beams of the plurality of projection beams are parallel to each other, capturing an image of the field of view, wherein the object is visible in the image and a projection pattern generated by the at least two beams of the plurality of projection beams is also visible in the image, and calculating the distance to the object using information in the image.

In another embodiment, a method for calculating a distance to an object includes projecting a plurality of projection beams from each of a plurality of projection points, wherein the plurality of projection points is arranged around a lens of an image capturing device, and wherein at least one beam of the plurality of projection beams is offset by a first angle relative to a line extending radially outward from an axis passing through a center of the lens, capturing an image of the field of view, wherein the object is visible in the image and a projection pattern generated by the at least one beam of the plurality of projection beams is also visible in the image, and calculating the distance to the object using information in the image.

BRIEF DESCRIPTION OF THE DRAWINGS

The teaching of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

In one embodiment, the present disclosure relates to a distance sensor. Distance sensors may be used in unmanned vehicles in order to help a computer vision system determine the distance from the vehicle to a particular object or point in the surrounding environment. For instance, a distance sensor may project one or more beams of light onto the object or point and then compute the distance according to time of flight (TOF), analysis of the reflected light (e.g., lidar), or other means. Conventional distance sensors of this type tend to be bulky, however, and thus may not be suitable for use in compact vehicles. Moreover, the sensors can be very expensive to manufacture and tend to have a limited field of view. For instance, even using an arrangement of multiple conventional imaging sensors provides a field of view that is less than 360 degrees.

Figure 1A:
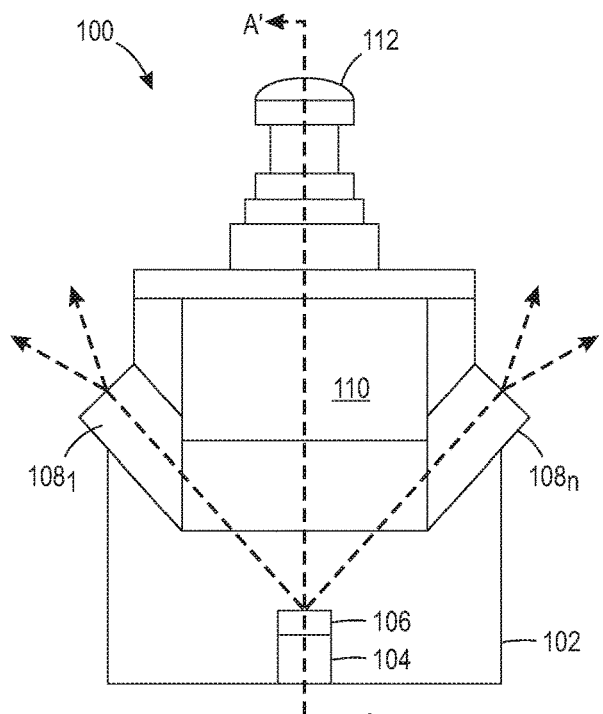
FIG. 1A illustrates a cross-sectional view of one embodiment of a distance sensor that may be used to generate optical configurations of the present disclosure.
Figure 1B:
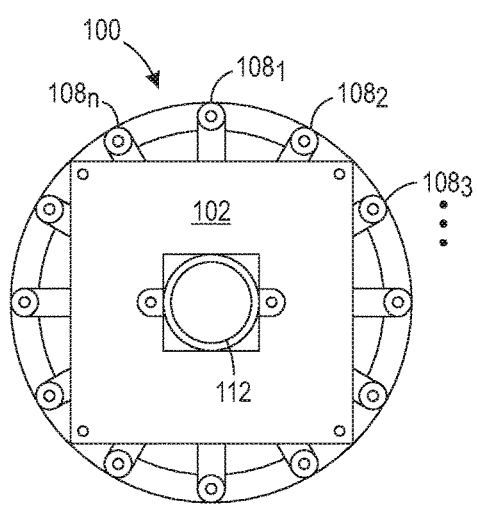
FIG. 1B illustrates a top view of the distance sensor of FIG. 1A.

Embodiments of the disclosure provide optical configuration refinements for a compact distance sensor, such as any of the distance sensors disclosed in U.S. patent application Ser. No. 14/920,246, filed Oct. 22, 2015. For instance, FIGS. 1A and 1B illustrate one embodiment of a distance sensor 100 that may be used to generate optical configurations of the present disclosure. In particular, FIG. 1A illustrates a cross-sectional view of the distance sensor 100, while FIG. 1B illustrates a top view of the distance sensor 100 of FIG. 1A. The distance sensor 100 may be mounted, for example, to an unmanned vehicle.

As illustrated in FIG. 1A, the distance sensor 100 comprises a plurality of components arranged within a compact housing 102. The components include at least one light source 104, a first beam splitting means, hereinafter referred to as a first diffractive optical element 106, an array of second beam splitting means, hereinafter referred to as second diffractive optical elements $108_1$-$108_n$ (and hereinafter collectively referred to as "second diffractive optical elements 108"), and an imaging sensor 110 including a wide-angle lens 112.

The components are arranged substantially symmetrically about a central axis A-A'. In one embodiment, the central axis A-A' coincides with the optical axis of the imaging sensor 110. In one embodiment, the light source 104 is positioned at a first end of the central axis A-A'. In one embodiment, the light source 104 is a laser light source that emits a single beam of light along the central axis A-A'. Hereinafter, the single beam emitted by the light source 104 may also be referred to as the "primary beam." In one embodiment, the light source 104 emits light of a wavelength that is known to be relatively safe to human vision (e.g., infrared). In a further embodiment, the light source 104 may include circuitry to adjust the intensity of its output. In a further embodiment, the light source 104 may emit light in pulses, so as to mitigate the effects of ambient light on image capture.

The first diffractive optical element (DOE) 106 is positioned along the central axis A-A' in proximity to the light source 104 (e.g., "in front" of the light source 104, relative to the direction in which light emitted by the light source 104 propagates). In particular, the first DOE 106 is positioned to intercept the single beam of light emitted by the light source 104 and to split the single or primary beam into a plurality of secondary beams. In one embodiment, the angles between the central axis A-A' and each of the secondary beams are equal. The first DOE 106 is any optical component that is capable of splitting the primary beam into a plurality of secondary beams that diverge from the primary beam in different directions. For example, in one embodiment, the first DOE 106 may include a conical mirror or holographic film. In this case, the plurality of secondary beams are arranged in a cone shape. In further embodiments, the primary beam may be split by means other than diffraction.

The array of second DOEs 108 is positioned along the central axis A-A' in proximity to the first DOE 106 (e.g., "in front" of the first DOE 106, relative to the direction in which light emitted by the light source 104 propagates). In particular, the array of second DOEs 108 is positioned such that the first DOE 106 is positioned between the light source 104 and the array of second DOEs 108. As more clearly illustrated in FIG. 1B, in one embodiment, the second DOEs 108 are arranged in a ring-shaped array, with the central axis A-A' passing through the center of the ring and the second DOEs 108 spaced at regular intervals around the ring. For instance, in one embodiment, the second DOEs 108 are spaced approximately thirty degrees apart around the ring. In one embodiment, the array of second DOES 108 is positioned "behind" a principal point of the imaging sensor 110 (i.e., the point where the optical axis A-A' intersects the image plane), relative to the direction in which light emitted by the light source 104 propagates.

Each second DOE 108 is positioned to intercept one of the secondary beams produced by the first DOE106 and to split the secondary beam into a plurality of (e.g., two or more) tertiary beams that are directed away from the second DOE 108 in a radial manner. Thus, each second DOE 108 defines a projection point of the sensor 100 from which a group of projection beams (or tertiary beams) is emitted into the field of view. In one embodiment, each respective plurality of tertiary beams fans out to cover a range of approximately one hundred degrees. The second DOEs 108 are any optical components that are capable of splitting a respective secondary beam into a plurality of tertiary beams that diverge from the secondary beam in different directions. For example, in one embodiment, each second DOE may include a conical mirror or holographic film. In other embodiments, however, the secondary beams are split by a means other than diffraction.

In one embodiment, each plurality of tertiary beams is arranged in a fan or radial pattern, with equal angles between each of the beams. In one embodiment, each of the second DOEs 108 is configured to project tertiary beams that create a different visual pattern on a surface. For example, one second DOE 108 may project a pattern of dots, while another second DOE 108 may project a pattern of lines or x's.

The imaging sensor 110 is positioned along the central axis A'A', in the middle of the array of second DOEs 108 (e.g., at least partially "in front" of the array of second DOEs 108, relative to the direction in which light emitted by the light source 104 propagates). In one embodiment, the imaging sensor 110 is an image capturing device, such as a still or video camera. As discussed above, the imaging sensor 110 includes a wide-angle lens, such as a fisheye lens, that creates a hemispherical field of view. In one embodiment, the imaging sensor 110 includes circuitry for calculating the distance from the distance sensor 100 to an object or point.

In another embodiment, the imaging sensor includes a network interface for communicating captured images over a network to a processor, where the processor calculates the distance from the distance sensor 100 to an object or point and then communicates the calculated distance back to the distance sensor 100.

Thus, in one embodiment, the distance sensor 100 uses a single light source (e.g., light source 104) to produce multiple projection points from which sets of projection beams (e.g., comprising patterns of dots or lines) are emitted. One or more of the projection beams may, in turn, form a projection plane. In one embodiment, at least one of the projection planes is parallel to the central axis A-A' of the sensor 100. In a further embodiment, this projection plane is projected from a single one of the projection points or DOEs 108 (e.g., such that the plane would be vertically orientated in FIG. 1).

The distance from the distance sensor 100 to an object can be calculated from the appearances of the projection beams in the field of view (as described in U.S. patent application Ser. No. 14/920,246, filed Oct. 22, 2015). In particular, the use of the first and second DOEs makes it possible to generate a plurality of projection points around the lens, from the single beam of light emitted by the light source. This allows the distance sensor 100 maintain a relatively compact form factor while measuring distance within a wide field of view. The imaging sensor 110 and the light source 104 can also be mounted in the same plane in order to make the design more compact; however, in one embodiment, the second DOEs 108₁-108ₙ are positioned behind the principal point of the imaging sensor 110 in order to increase the field of view that can be covered by the projection beams (e.g., such that the depth angle of the field of view is closer to a full 180 degrees, or, in some cases, even greater).

Moreover, since each of the second DOEs 108 projects tertiary beams of a different pattern, the circuitry in the imaging sensor can easily determine which beams in a captured image were created by which of the second DOEs 108. This facilitates the distance calculations, as discussed in greater detail below.

Although the sensor 100 is illustrated as including only a single light source 104 (which reduces the total number of components in the sensor 100), in alternative embodiments, the sensor may include a plurality of light sources. In this case, the first DOE 106 may not be necessary. Instead, in one embodiment, each light source of the plurality of light sources may correspond to one DOE in an array of DOEs (such as the array of second DOEs 108 in FIG. 1A and FIG. 1B). Notably, this configuration still produces a plurality of projection points (e.g., one projection point defined by each DOE in the array) around the imaging sensor's lens and from which sets of projection beams may be emitted.

Figure 2:
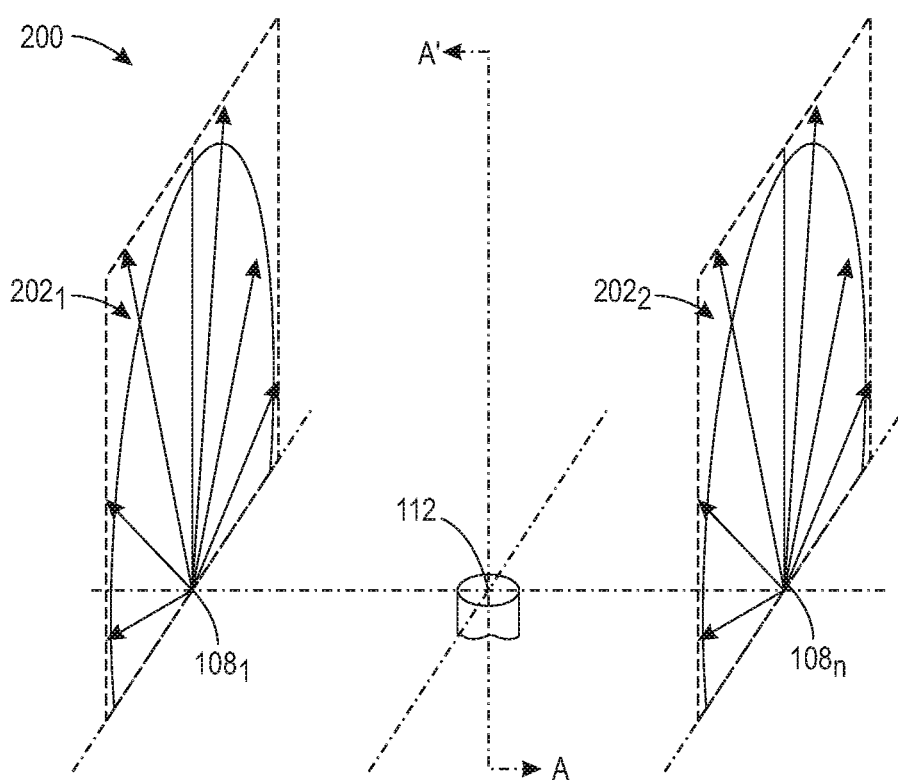
FIG. 2 illustrates a first embodiment of a pattern that may be projected by the distance sensor of FIG. 1, or by a distance sensor having similar capabilities.

In some embodiments, the distance sensor 100 may be configured to produce projection beams that form parallel patterns in a field of view. FIG. 2, for instance, illustrates a first embodiment of a pattern 200 that may be projected by the distance sensor 100 of FIG. 1, or by a distance sensor having similar capabilities. FIG. 2 also illustrates some of the components of the distance sensor 100 of FIG. 1 in an exploded view, including the lens 112 and two of the DOEs or projection points 108₁ and 108ₙ (hereinafter collectively referred to as "projection points 108").

All illustrated, the pattern 200 comprises two sets 202₁ and 202ₙ (hereinafter collectively referred to as "sets 202") of projection beams. In one example, each set 202 of projection beams fans out radially from one of the projection points 108 of the sensor 100 to form a plane. As also illustrated, the planes defined by the two sets 202 of projection beams are substantially parallel to each other, due to the projection points 108 being spaced approximately 180 degrees apart from each other around the central axis A-A' of the sensor 100.

Figure 3:
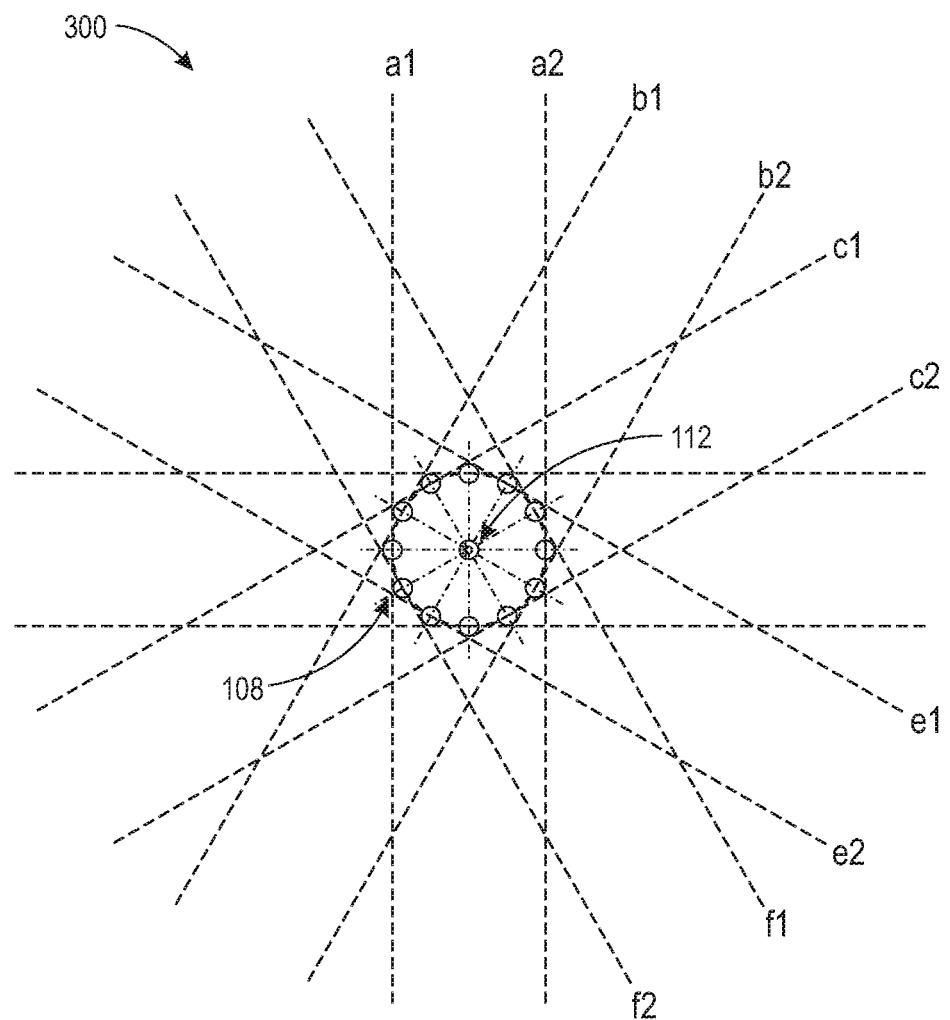
FIG. 3 illustrates a second embodiment of a pattern that may be projected by the distance sensor of FIG. 1, or by a distance sensor having similar capabilities.

By enabling multiple pairs of DOEs, where the DOEs in each pair of DOEs are spaced approximately 180 degrees apart from each other around the central axis A-A', a plurality of parallel projection patterns or planes can be produced. FIG. 3, for instance, illustrates a second embodiment of a pattern 300 that may be projected by the distance sensor 100 of FIG. 1, or by a distance sensor having similar capabilities. FIG. 3 also illustrates a top view of some of the components of the distance sensor 100 of FIG. 1 in an exploded view, including the lens 112 and the DOEs or projection points 108 surrounding the lens 112.

All illustrated, the pattern 300 comprises multiple parallel pairs of projection beams, indicated by the pairs of dashed lines a1 and a2 through f1 and f2. As in FIG. 2, the planes defined by each pair of projection beams (e.g., a1 and a2) are substantially parallel to each other, due to the corresponding projection points 108 being spaced approximately 180 degrees apart from each other around the central axis A-A' of the sensor 100.

Figure 4:
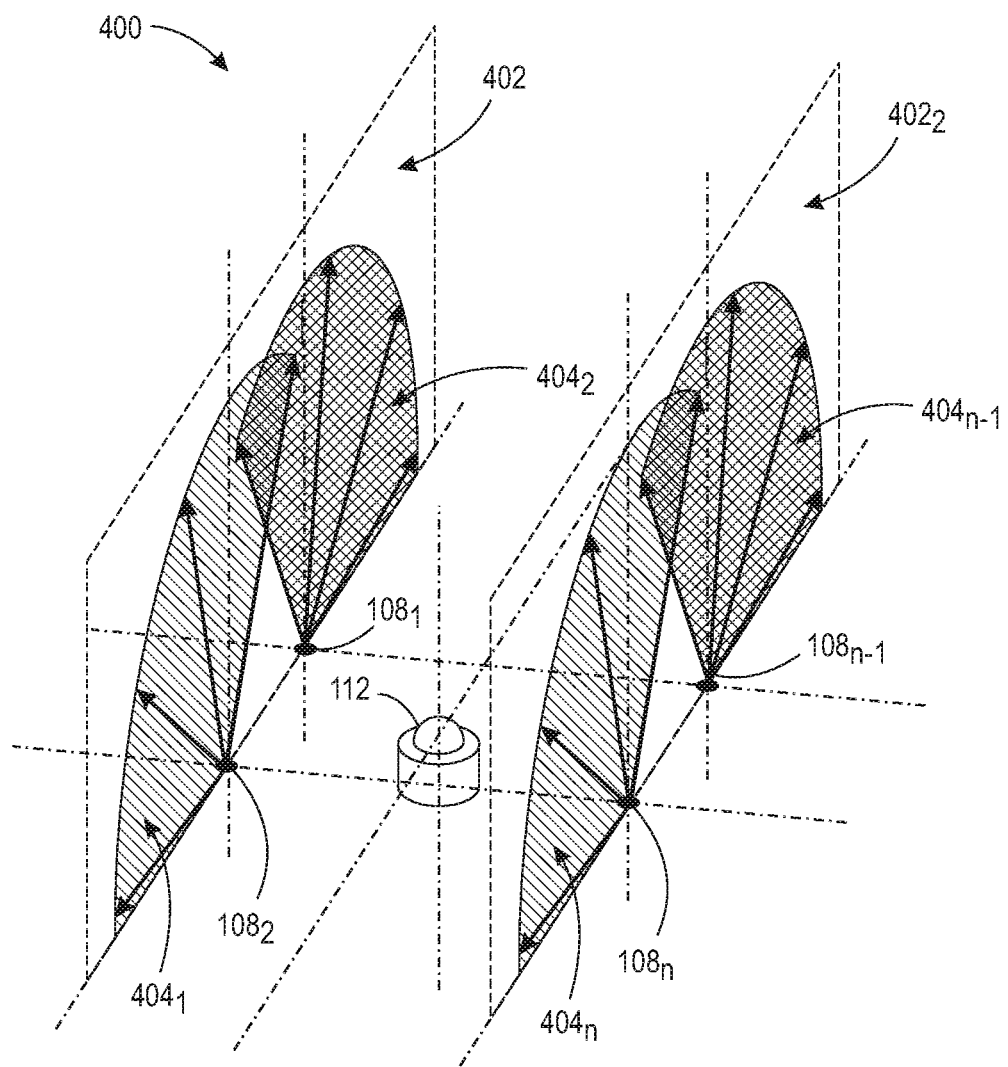
FIG. 4 illustrates a third embodiment of a pattern that may be projected by the distance sensor of FIG. 1, or by a distance sensor having similar capabilities.

In some embodiments, each pattern or plane that makes up a pair of parallel patterns is generated using at least two light sources and two DOEs or projection points, rather than one light source and one DOE. This is because some light sources, even when operating in conjunction with a DOE, may not be capable of generating a set of projection beams that fans out in an arc of larger than ninety degrees. FIG. 4, for instance, illustrates a third embodiment of a pattern 400 that may be projected by the distance sensor 100 of FIG. 1, or by a distance sensor having similar capabilities. FIG. 4 also illustrates some of the components of the distance sensor 100 of FIG. 1 in an exploded view, including the lens 112 and four of the DOEs or projection points 108₁-108ₙ (hereinafter collectively referred to as "projection points 108"). In one embodiment, each of the DOEs 108 corresponds to a different light source (not shown) of the sensor 100.

As illustrated, the pattern 400 comprises two projection patterns or planes 402₁ and 402₂ (hereinafter collectively referred to as "projection planes 402"). In one example, each projection plane 402, in turn, comprises two sets 404₁ and 404₂ or 404ₙ₋₁ and 404ₙ (hereinafter collectively referred to as "sets 404") of projection beams that fan out radially from one of the projection points 408 of the sensor 100. In this case, each set 404 of projection beams fans out in an arc of approximately ninety degrees, and each pair of sets 404 spans an arc of approximately 180 degrees which corresponds to one projection plane 402. As illustrated, the projection planes 402 are substantially parallel to each other, due to the projection points 408 being spaced approximately 180 degrees apart from each other around the central axis A-A' of the sensor 100.

Figure 5:
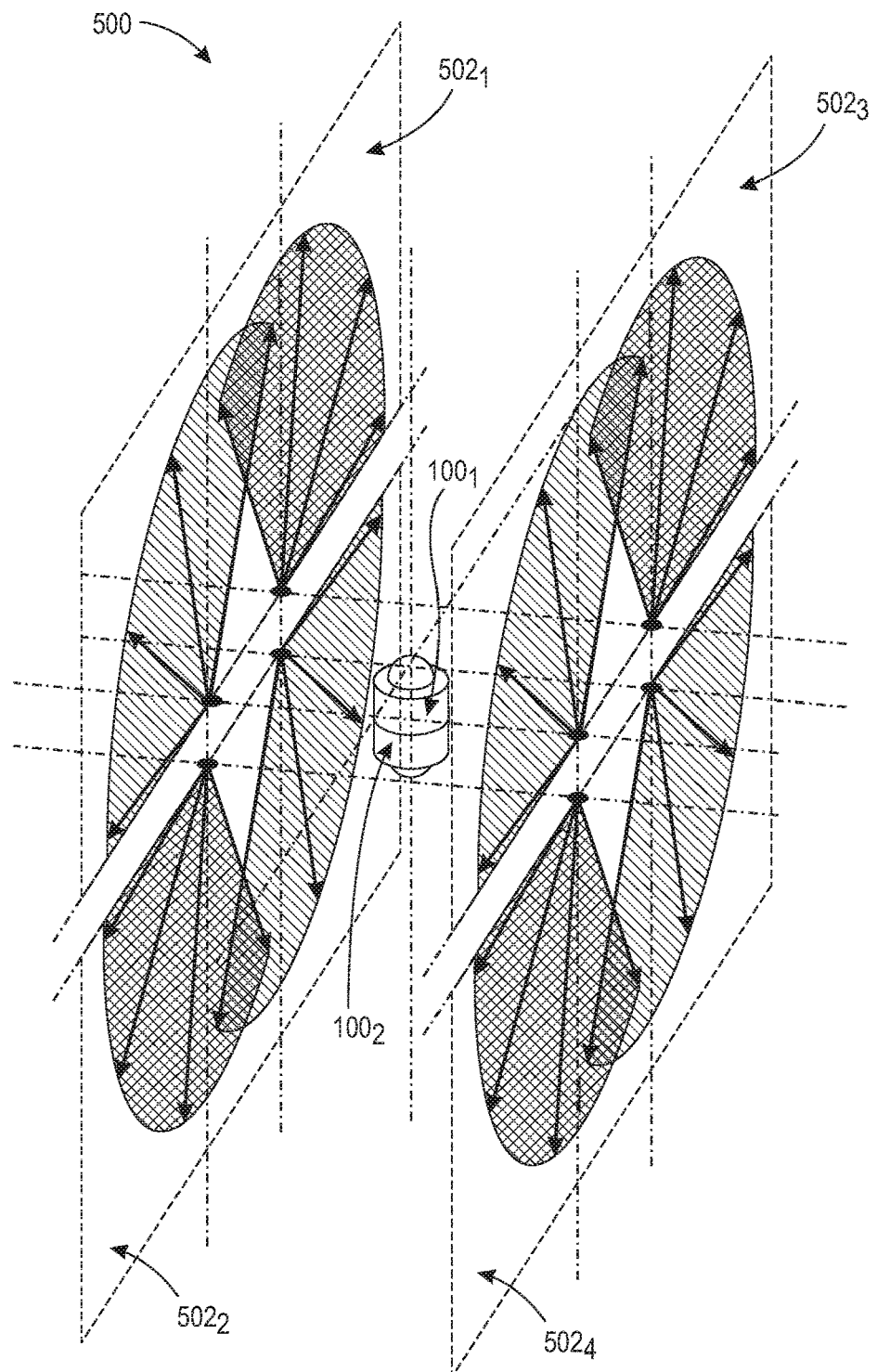
FIG. 5 illustrates a fourth embodiment of a pattern that may be projected by two of the distance sensors of FIG. 1 mounted back-to-back, or by two distance sensors having similar capabilities mounted back-to-back.

In further embodiments, two sensors similar to the sensor 100 illustrated in FIG. 1 could be mounted back-to-back, enabling the light sources and DOEs to produce a projection pattern that covers approximately 360 degrees in a field of view. FIG. 5, for instance, illustrates a fourth embodiment of a pattern 500 that may be projected by two of the distance sensors 100₁ and 100₂ (hereinafter collectively referred to as "distance sensors 100") of FIG. 1 mounted back-to-back, or by two distance sensors having similar capabilities mounted back-to-back. FIG. 5 also illustrates some of the components of the distance sensors 100 of FIG. 1 in an exploded view, including the lens and four of the DOEs or projection points of each sensor 100. In one embodiment, each of the DOEs corresponds to a different light source (not shown) of the associated sensor 100.

As illustrated, the pattern 500 comprises four projection patterns or planes $502_1$-$502_4$ (hereinafter collectively referred to as "projection planes 502"). In one example, each projection plane 502, in turn, comprises two sets of projection beams that fan out radially from one of the projection points of the associated sensor 100. In this case, as in FIG. 4, each set of projection beams fans out in an arc of approximately ninety degrees, and each corresponding projection plane 502 spans an arc of approximately 180 degrees. When two such projection planes 502 are projected back-to-back, an arc of approximately 350 degrees can be covered, as illustrated. Thus, two 360 degree projection planes can be generated that are substantially parallel to each other.

Figure 6:
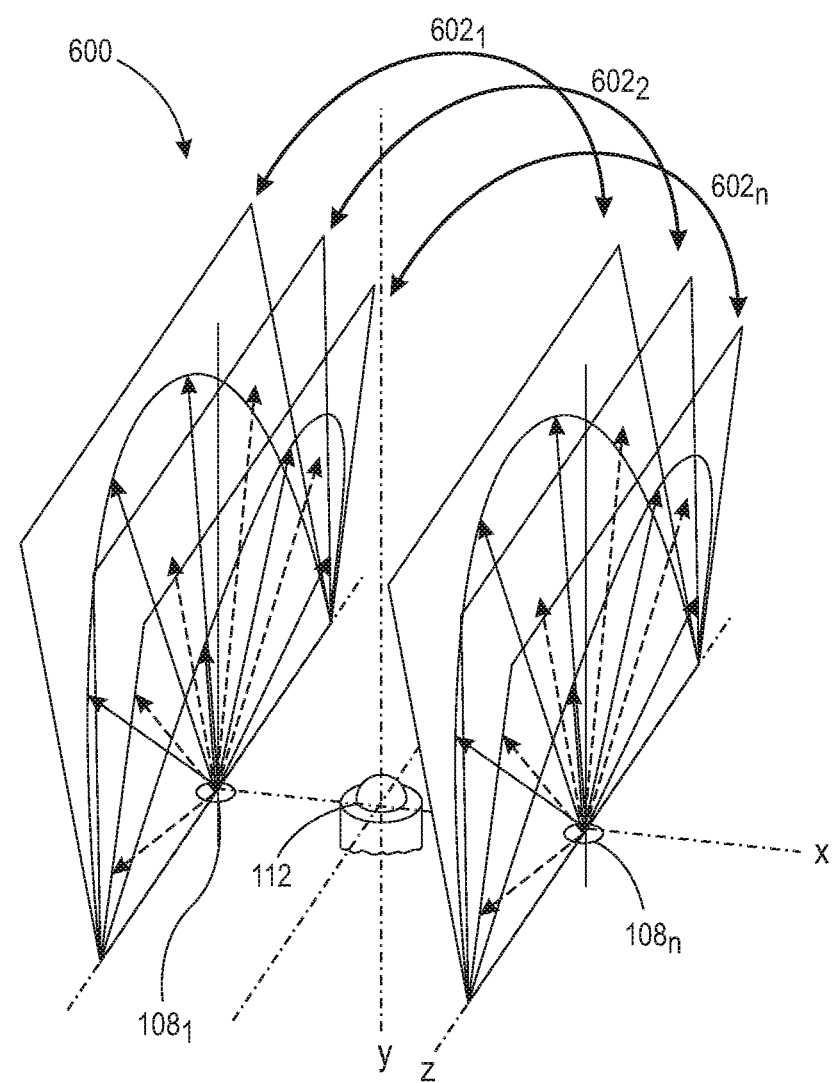
FIG. 6 illustrates a fifth embodiment of a pattern that may be projected by the distance sensor of FIG. 1, or by a distance sensor having similar capabilities.

In further embodiments, one DOE or projection point may generate a plurality of projection planes, where the plurality of projection planes are offset from each other by some angle. Moreover, two DOEs or projection points each generating a plurality of projection planes may be used to generate multiple parallel pairs of projection planes. FIG. 6, for instance, illustrates a fifth embodiment of a pattern 600 that may be projected by the distance sensor 100 of FIG. 1, or by a distance sensor having similar capabilities. FIG. 6 also illustrates some of the components of the distance sensor 100 of FIG. 1 in an exploded view, including the lens 112 and two of the DOEs or projection points $108_1$ and $108_n$ (hereinafter collectively referred to as "projection points 108"). In one embodiment, each of the DOEs 108 corresponds to a different light source (not shown) of the sensor 100.

As illustrated, the pattern 600 comprises a plurality of pairs $602_1$-$602_n$ (hereinafter collectively referred to as "pairs 602") of projection planes (where each individual projection plane comprises a set of projection beams that fan out in an arc of up to 180 degrees from a projection point 108, as described above). In this case, each projection point 108 generates one of the projection planes in each pair 602 of projection planes. Moreover, each projection point 108 generates a plurality of projection planes that fan out from each other in a direction substantially perpendicular to the direction in which the individual projection beams fan out. For instance, in FIG. 6, the individual projection beams generated by a projection point 108 fan out radially in a direction along the z axis, while the plurality of projection planes generated by the projection point 108 fan out in a direction along the x axis.

Figure 7:
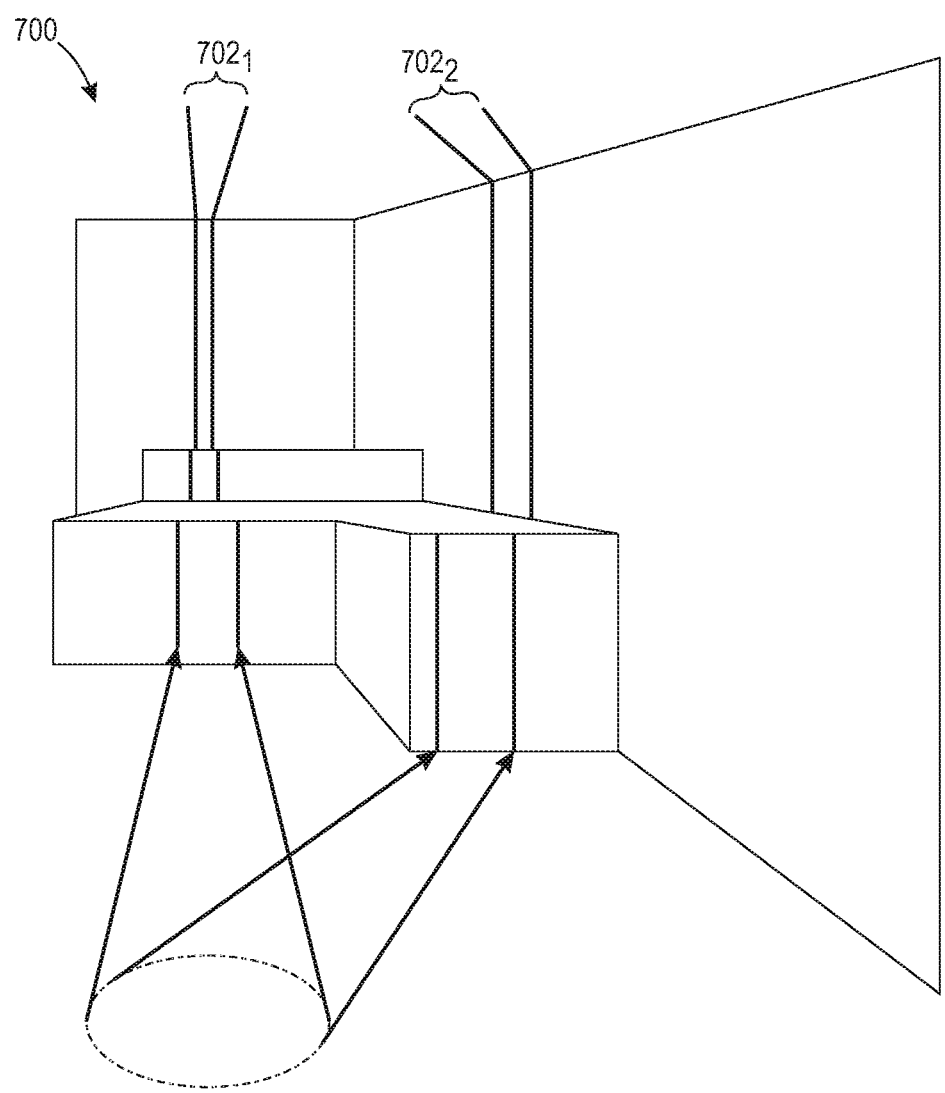
FIG. 7 illustrates an example field of view into which two pairs of parallel patterns have been projected.

FIG. 7 illustrates an example field of view 700 into which two pairs of parallel patterns $702_1$ and $702_2$ (hereinafter collectively referred to as parallel patterns 702") comprising continuous line patterns have been projected. Distance to an object in the field of view can be easily detected through the lateral movement of the parallel patterns 702, because the projection patterns 702 are always continuously linear even if the distance changes. The size and dimensions of the object can also be directly calculated.

Figure 17:
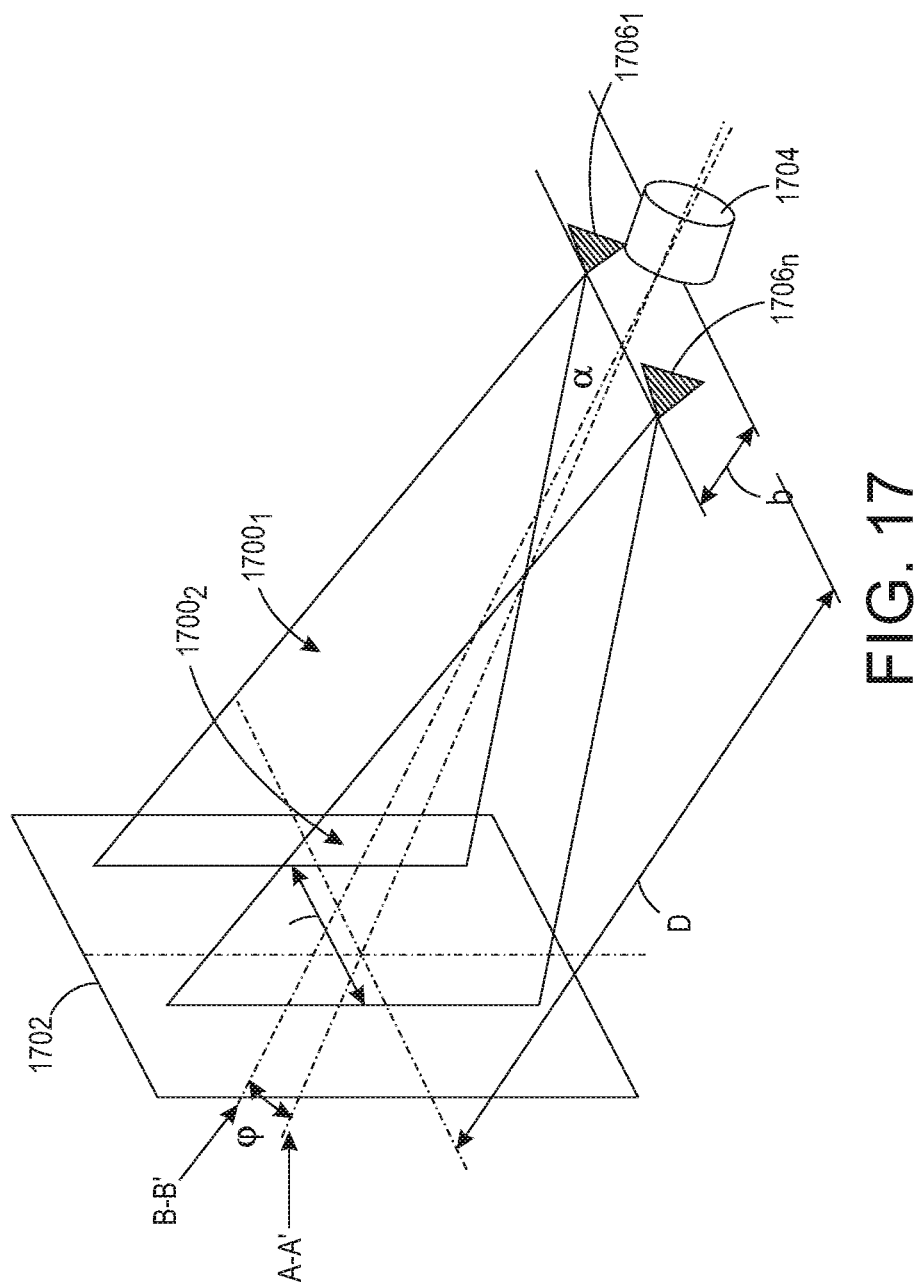
FIG. 17 is an illustration showing relevant parameters for calculating the distance to an object using a pair of parallel projection planes.

FIG. 17, for example, is an illustration showing relevant parameters for calculating the distance to an object using a pair of parallel projection planes $1700_1$ and $1700_2$ (hereinafter collectively referred to as "projection planes 1700"). As illustrated, the projection planes project a pair of parallel lines onto an object 1702 that is positioned a distance, D, from the imaging sensor 1704 of the distance sensor. The projection planes 1700 are spaced apart by a projection interval a, where the midpoint of the interval (or projection center) is defined by an axis B-B'. A distance of φ exists between the axis B-B' and the central axis A-A' of the distance sensor. The projection points $1706_1$-$1706_n$ (hereinafter collectively referred to as "projection points 1706") are set a distance b in front of the imaging sensor 1704.

Figure 18:
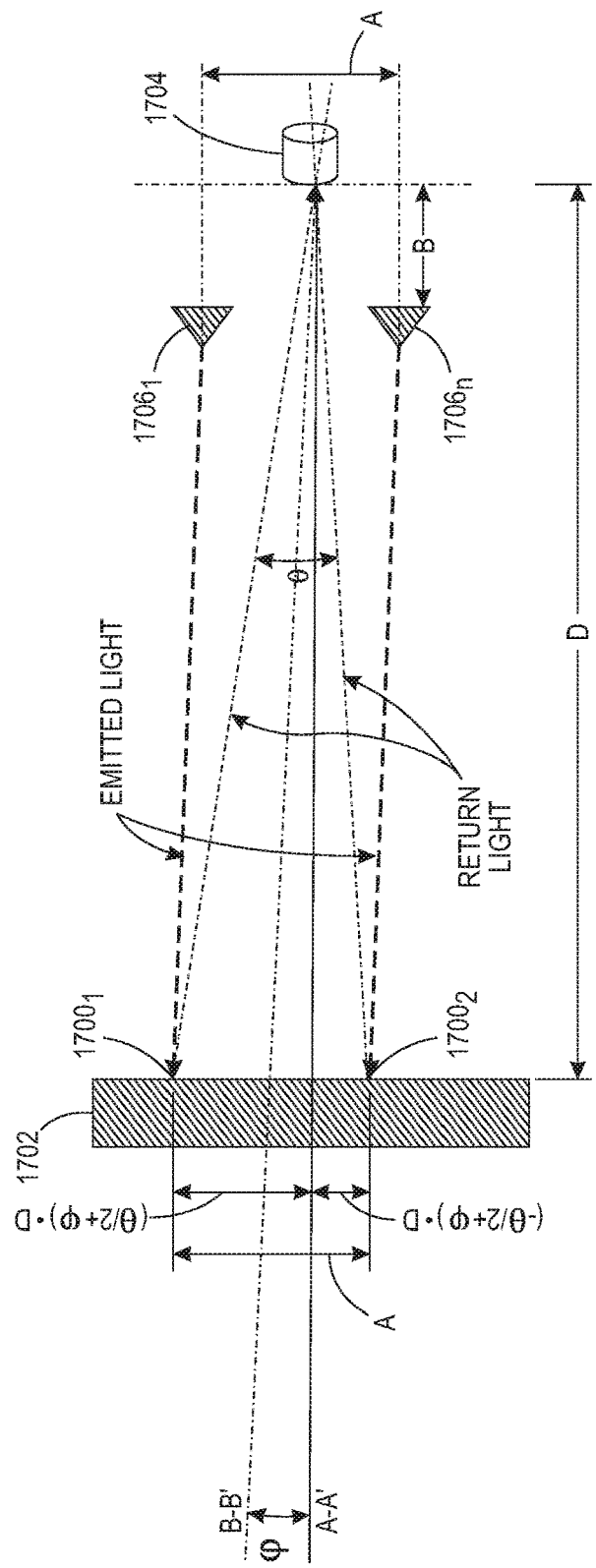
FIG. 18 illustrates one embodiment of an algorithm for calculating the distance from the imaging sensor of FIG. 17 to the object of FIG. 17.

FIG. 18 illustrates one embodiment of an algorithm for calculating the distance D from the imaging sensor 1704 of FIG. 17 to the object 1702 of FIG. 17. In addition to the parameters illustrated in FIG. 17, FIG. 18 illustrates that a portion of the light emitted by the projection points 1706 (i.e., the projection planes, which are separated by the projection interval a) is reflected by the object 1702 and returns to the imaging sensor 1704 as return light. The beams of the return light are separated by a distance of θ, which is given by an image captured by the imaging sensor 1704.

When the distance φ between the axis B-B' and the central axis A-A' of the distance sensor is known to be zero, $(a/2)/D=\tan(\theta/2)$. Thus, the distance D from the imaging sensor 1704 to the object 1702 may be calculated as $D=(a/2)/\tan(\theta/2)$. Also, $D \approx a/\tan(\theta)$ when $a \ll D$.

When the distance φ between the axis B-B' and the central axis A-A' of the distance sensor is known to be a non-zero number, $D \approx a/\tan(\theta)$ when $\theta=(\theta/2+\varphi)-(-\theta/2+\varphi)$.

Figure 8:
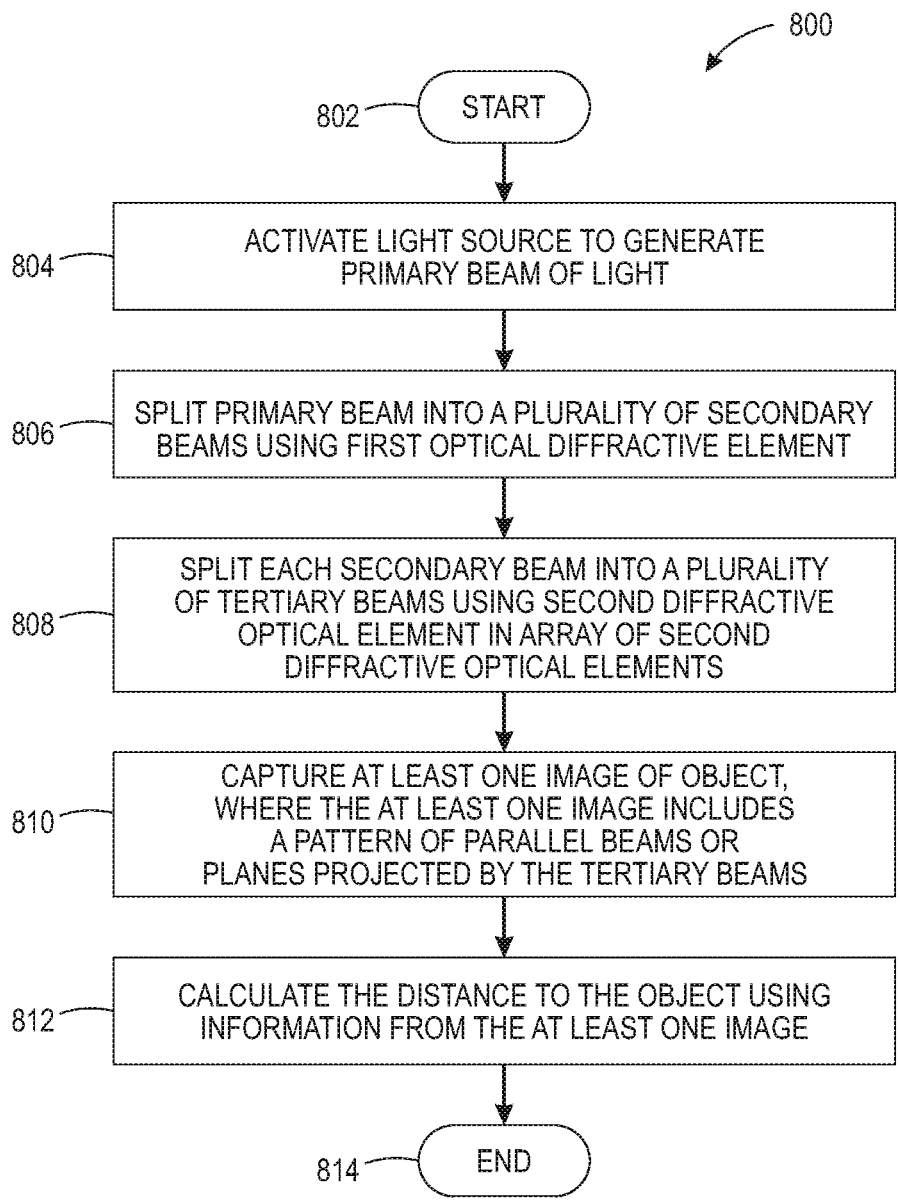
FIG. 8 illustrates a flowchart of a method for calculating the distance from a sensor to an object or point in space.
Figure 16:
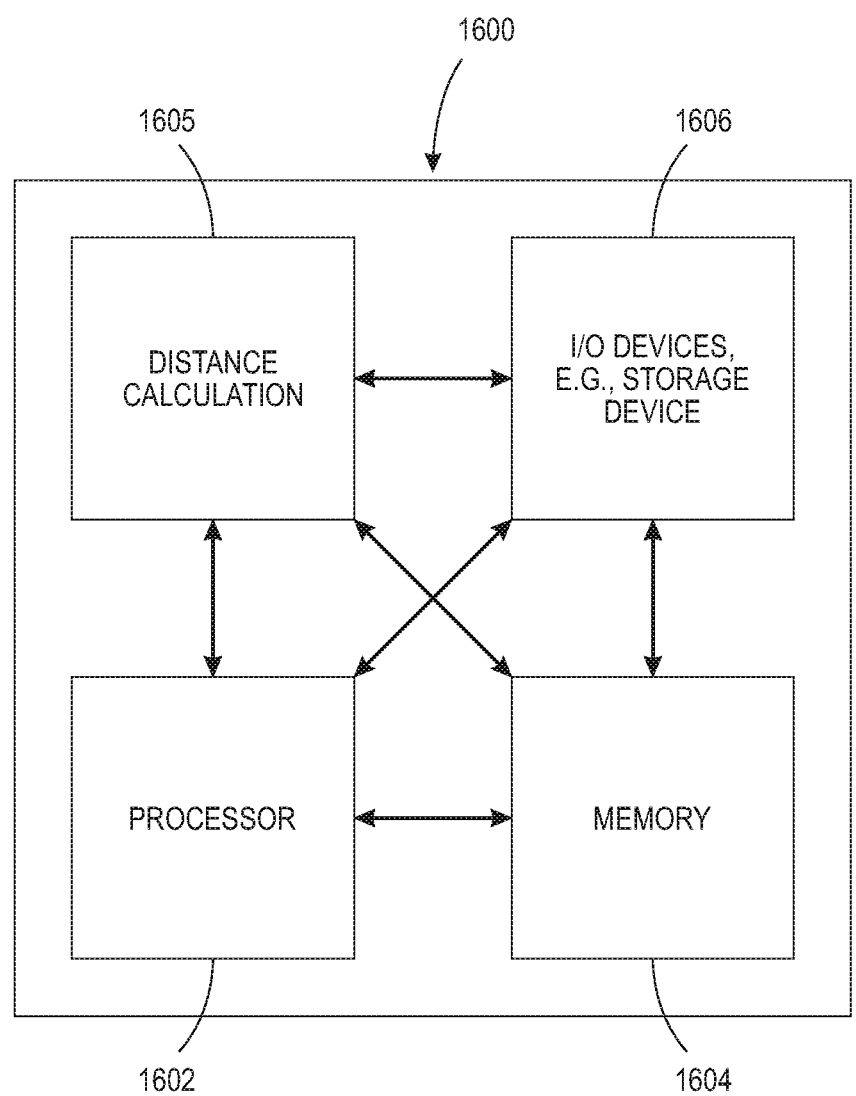
FIG. 16 depicts a high-level block diagram of a general-purpose computer suitable for use in performing the functions described herein.

FIG. 8 illustrates a flowchart of a method 800 for calculating the distance from a sensor to an object or point in space. In one embodiment, the method 800 may be performed by a processor integrated in an imaging sensor (such as the imaging sensor 110 illustrated in FIGS. 1A-1B) or a general purpose computing device as illustrated in FIG. 16 and discussed below.

The method 800 begins in step 802. In step 804, a light source is activated to generate a primary beam of light. In one embodiment, a single primary beam is generated by a single light source; however, in other embodiments, multiple primary beams are generated by multiple light sources. In one embodiment, the light source or light sources comprise a laser light source.

In optional step 806, the primary beam is split into a plurality of secondary beams using a first beam splitting means (e.g., a diffractive optical element) that is positioned in the path along which the primary beam propagates. The first beam splitting means may be, for example, a conical mirror. Step 806 is performed, for example, when the distance sensor (of which the imaging sensor is a part) includes only a single light source.

In step 808, each beam in the plurality of secondary beams is split into a plurality of projection or tertiary beams using a second beam splitting means (e.g., second diffractive optical element) in an array of beam splitting means. In one embodiment, a plurality of second beam splitting means are positioned in a ring, such that each second beam splitting means is positioned in the path along which one of the secondary beams propagates. In one embodiment, at least some of the second beam splitting means are conical mirrors. In one embodiment, where the distance sensor comprises a plurality of light sources, the method 800 may proceed directly from step 804 to step 808. In this case, each primary beam of a plurality of primary beams (generated using the plurality of light sources) is directly split into a plurality of projection beams by one of the second beam splitting means.

In step 810, at least one image of the object or point is captured. The image includes a pattern that is projected onto the object or point and onto the surrounding space. The pattern is created by each of the projection beams projecting a series of dots, lines, or other shapes onto the object, point, or surrounding space. In one example, the pattern comprises one or more parallel pairs of projection beams or projection planes, for example as illustrated in FIGS. 2-7.

In step 812, the distance from the sensor to the object or point is calculated using information from the images captured in step 810. In one embodiment, a triangulation technique is used to calculate the distance. For example, the positional relationships between parts of the patterns projected by the sensor can be used as the basis for the calculation.

The method 800 ends in step 814. Thus, the method 800, in combination with the sensor depicted in FIGS. 1A-1B or with a sensor having similar capabilities, can measure the distance from the sensor to an object or point in space in a single cycle of image capture and calculation.

Figure 9:
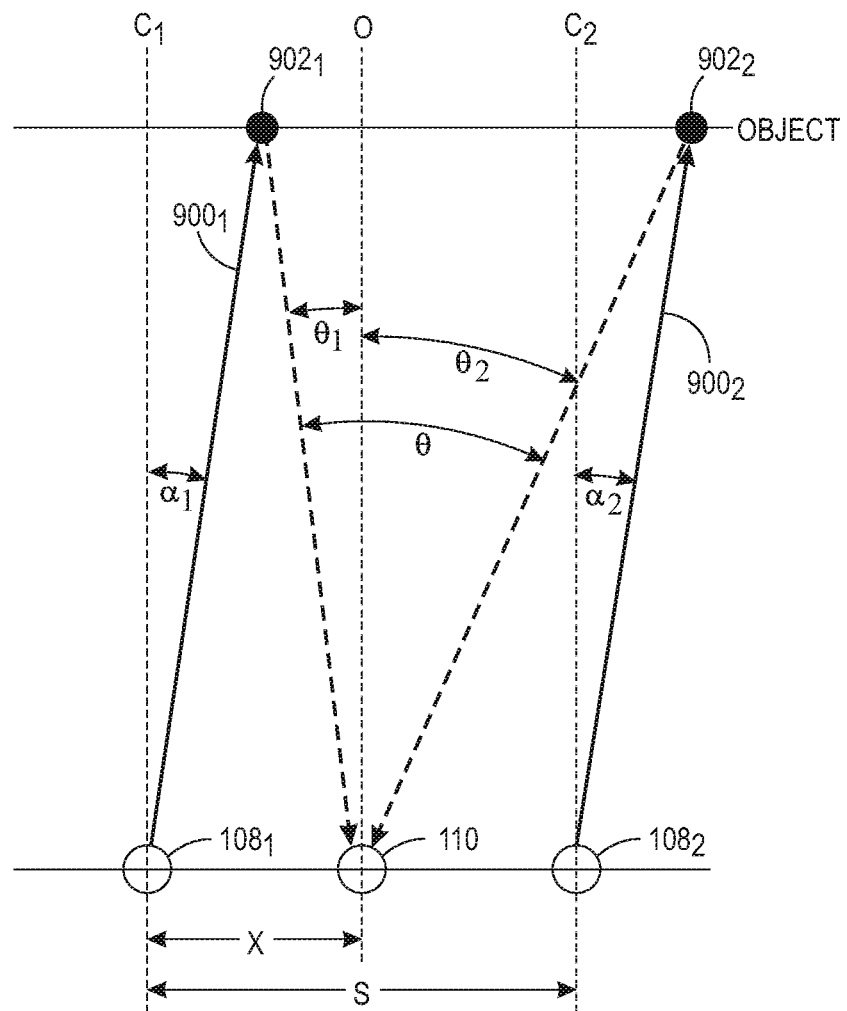
FIG. 9 illustrates a triangulation technique by which the distance from the sensor to the object or point may be calculated in the method illustrated in FIG. 8.

FIG. 9, for example, illustrates a triangulation technique by which the distance from the sensor to the object or point may be calculated in step 812. In particular, FIG. 9 illustrates the example imaging sensor 110 of FIG. 1, as well as two of the projection points, which may be defined by two of the second diffractive optical elements $108_1$ and $108_2$. The projection points are spaced equal distances, x, from the imaging sensor 110, such that there is a distance of s between the two projection points (e.g., x=s/2). Each of the projection points emits a respective projection beam $900_1$ and $900_2$, which is incident upon the object to create a respective point $902_1$ and $902_2$ (e.g., dot or line) in a pattern. These points $902_1$ and $902_2$ are detected by the imaging sensor 110 and may be used to calculate the distance, D, between the imaging sensor 110 and the object as follows:

$$D = s/(-\tan \alpha_2 + \tan \alpha_1 + \tan \theta_2 + \tan \theta_1) \quad \text{(EQN. 1)}$$

where $\alpha_2$ is the angle formed between the projection beam $900_2$ and a central axis $c_2$ of the second diffractive optical element $108_2$, $\alpha_1$ is the angle formed between the projection beam $900_1$ and a central axis $c_1$ of the second diffractive optical element $108_1$, $\theta_2$ is the angle formed between the central optical axis O of the imaging sensor 110 and the angle at which the imaging sensor 110 perceives the point $902_2$ created by the projection beam $900_2$, and $\theta_1$ is the angle formed between the central optical axis O of the imaging sensor 110 and the angle at which the imaging sensor 110 perceives the point $902_1$ created by the projection beam $900_1$.

EQN. 1 is derived from the following relationships:

$$D^*\tan \alpha_1 + D^*\tan \theta_1 = x \quad \text{(EQN. 2)}$$

$$D^*\tan \alpha_2 + D^*\tan \theta_2 = s - x \quad \text{(EQN. 3)}$$

EQNs. 2 and 3 allow one to calculate the distance from a source of a projection pattern (comprising, e.g., a pattern of dots) to an object onto which the projection pattern is projected. The distance is calculated based on the positional relationship between the points of light (e.g., the dots) that form the projection pattern when the points of light are emitted by different projection points around the source. In this embodiment, the positional relationships between the points of light are known a priori (i.e., not measured as part of the calculation).

Figure 10:
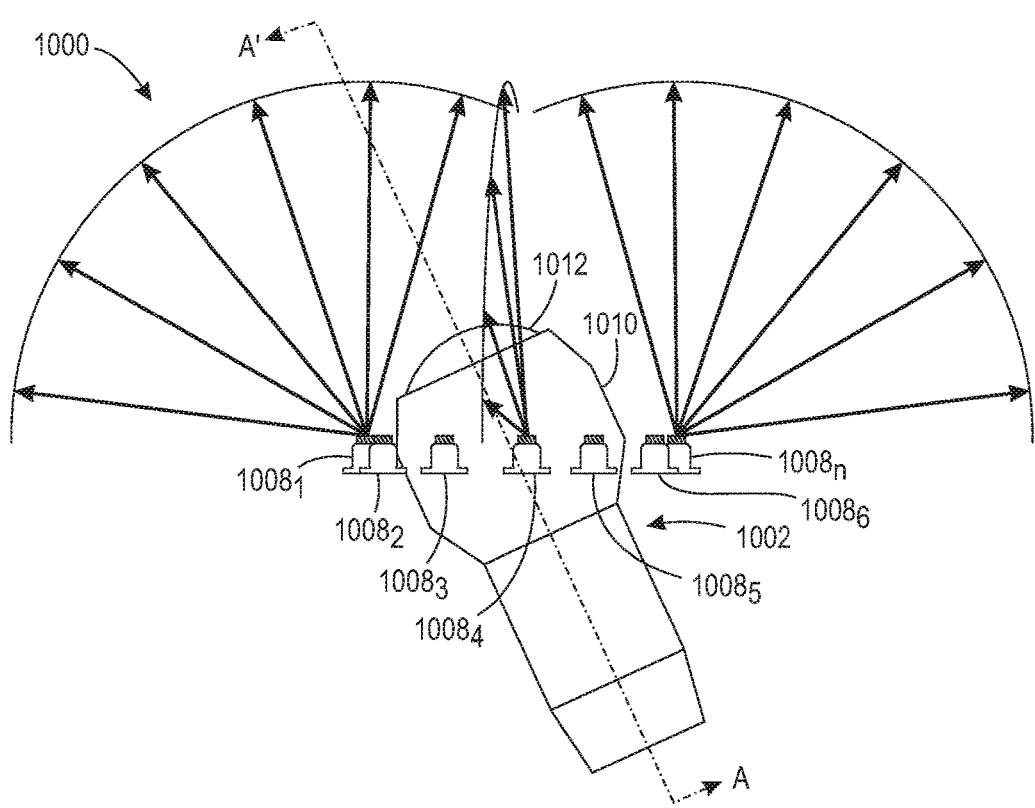
FIG. 10 illustrates a second embodiment of a distance sensor that may be used to generate optical configurations of the present disclosure.

In further embodiments, distance calculations may be facilitated in different environments by tilting an angle of the imaging sensor 110 relative to the projection points or DOEs 108. FIG. 10, for instance, illustrates a second embodiment of a distance sensor 1000 that may be used to generate optical configurations of the present disclosure. The distance sensor 1000 may be configured in a manner similar to the distance sensor 100 of FIGS. 1A and 1B, however, the illustration in FIG. 10 has been simplified for ease of explanation.

As illustrated in FIG. 10, the distance sensor 1000 comprises a plurality of components arranged within a compact housing 1002. The housing 1002 may contain at least one of: a light source, a first beam splitting means or a first DOE, an array of second beam splitting means, hereinafter referred to as second diffractive optical elements $1008_1$-$1008_n$ (and hereinafter collectively referred to as "second DOEs 1008"), and an imaging sensor 1010 including a wide-angle lens 1012.

The components are arranged substantially symmetrically about a central axis A-A'. In one embodiment, the central axis A-A' coincides with the optical axis of the imaging sensor 1010. Although not illustrated, the light source is positioned at a first end of the central axis A-A', and the first DOE, if included, is positioned along the central axis A-A' in proximity to the light source (e.g., "in front" of the light source, relative to the direction in which light emitted by the light source propagates). In particular, the first DOE is positioned to intercept a single beam of light emitted by the light source and to split the single or primary beam into a plurality of secondary beams The array of second DOEs 1008 is positioned along the central axis A-A' in proximity to the first DOE (e.g., "in front" of the first DOE, relative to the direction in which light emitted by the light source propagates). In one embodiment, the second DOEs 1008 are arranged in a ring-shaped array, with the central axis A-A' passing through the center of the ring and the second DOEs 1008 spaced at regular intervals around the ring. However, as illustrated in FIG. 10, portions of the sensor 1000 arranged along the central axis A-A' (e.g., at least the imaging sensor 1010 and the lens 1012) may be rotated independently of the array of second DOEs 1008, such that the central axis A'A' is tilted relative to the projection planes projected by the array of second DOEs 1008.

In one embodiment, the second DOEs 1008 are spaced approximately thirty degrees apart around the ring. In one embodiment, the array of second DOES 1008 is positioned "behind" a principal point of the imaging sensor 1010 (i.e., the point where the optical axis A-A' intersects the image plane), relative to the direction in which light emitted by the light source propagates.

Each second DOE 1008 is positioned to intercept one of the secondary beams produced by the first DOE and to split the secondary beam into a plurality of (e.g., two or more) tertiary beams that are directed away from the second DOE 1008 in a radial manner. Thus, each second DOE 1008 defines a projection point of the sensor 1000 from which a group of projection beams (or tertiary beams) is emitted into the field of view. In one embodiment, each respective plurality of tertiary beams fans out to cover a range of approximately one hundred degrees.

In one embodiment, each plurality of tertiary beams is arranged in a fan or radial pattern, with equal angles between each of the beams. In one embodiment, each of the second DOEs 1008 is configured to project tertiary beams that create a different visual pattern on a surface. For example, one second DOE 1008 may project a pattern of dots, while another second DOE 1008 may project a pattern of lines or x's.

Figure 11:
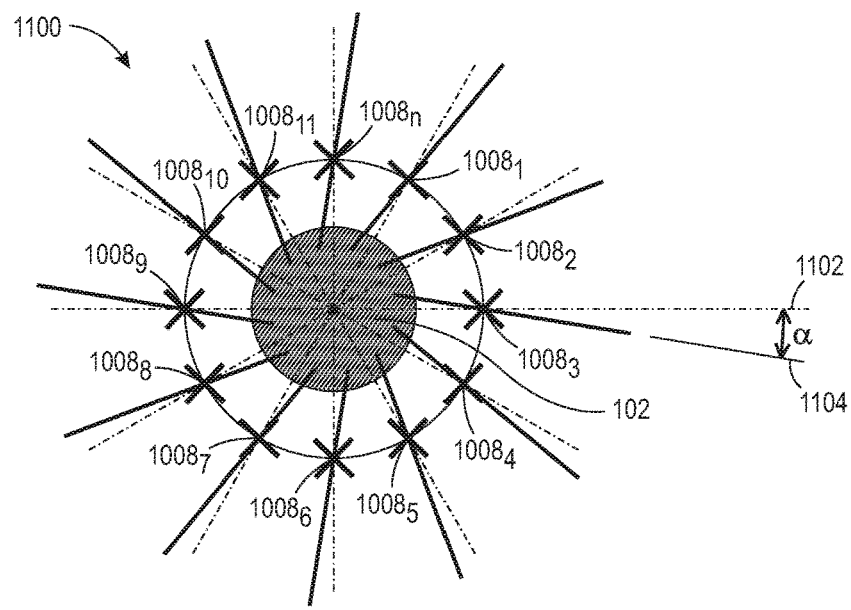
FIG. 11 illustrates a top view of an example projection pattern that may be projected by the distance sensor of FIG. 10.

The configuration illustrated in FIG. 10 results in the projection (or tertiary) beams projected from a DOE 1008 being tilted or offset by an angle α relative to a line extending radially outward from the central axis A-A'. For example, FIG. 11 illustrates a top view of an example projection pattern 1100 that may be projected by the distance sensor 1000 of FIG. 10. As illustrated, each of the DOEs 1008 generates a beam or plane; in the case of the DOE 1008$_3$, the projection beam is labeled as 1104. As further illustrated, the projection beam is not parallel to an imaginary reference line 1102 that extends directly radially outward from the central axis A-A' of the sensor 1000. The amount or angle α by which the projection beam 1104 is offset from the reference line 1102 is configurable, and may be directly related, for example, to an amount by which the central axis A-A' of the sensor 1000 is tilted relative to the array of second DOEs 1008. In one example, the angle α is the same for every projection beam generated by each of the DOEs 1008. However, in other examples, the angle α may be different for at least two of the projection beams.

The amount by which each of the projection artifacts (e.g., dots, dashes, x's, etc.) making up a projection beam moves relative to the distance from the sensor 1100 may vary with the size of the angle α. For instance, when the angle α increases, a projection artifact's movement relative to the distance from the sensor 1100 will also increase. In addition, the line density (e.g., how close multiple projection beams projected by a single DOE are to each other) will decrease with an increase in the angle α, as discussed in further detail below with respect to FIGS. 14A-14D. By properly configuring the angle α, a projection pattern can be generated that allows for easy identification of individual projection artifacts and easy calculation of continuous line patterns.

Figure 12:
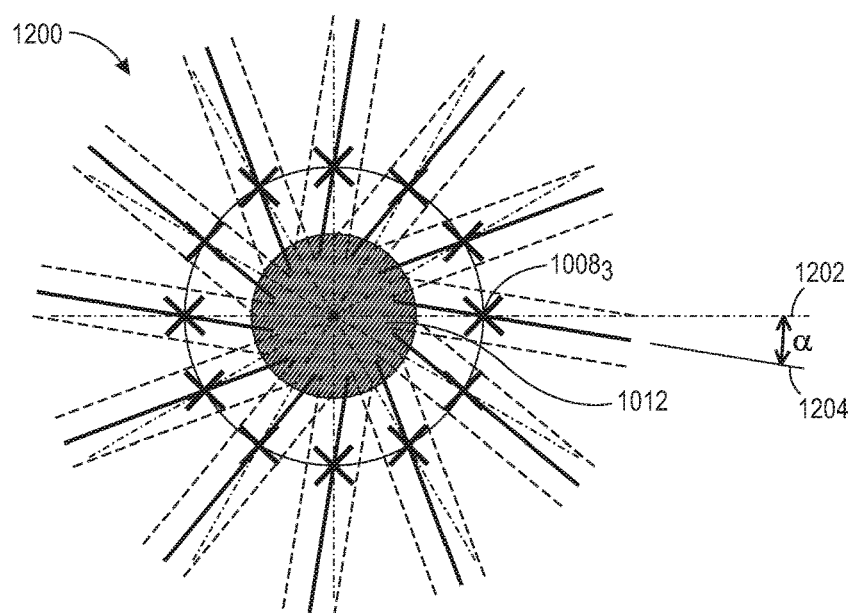
FIG. 12 illustrates a top view of another example projection pattern that may be projected by the distance sensor of FIG. 10.

FIG. 12 illustrates a top view of another example projection pattern 1200 that may be projected by the distance sensor 1000 of FIG. 10. In this case, each DOE 1008 may project a pattern of parallel beams or places, for example as discussed above in connection with FIGS. 1-7. Within each pattern of parallel beams projected by a common DOE, each beam (e.g., see beam 1204 projected by DOE 1008$_3$ as an example) is offset from the corresponding reference line 1202 by the same angle α. Thus, embodiment of the disclose combine the projection of parallel beams or planes with the tilting of those beams or planes relative to the central axis of the sensor.

Figure 13:
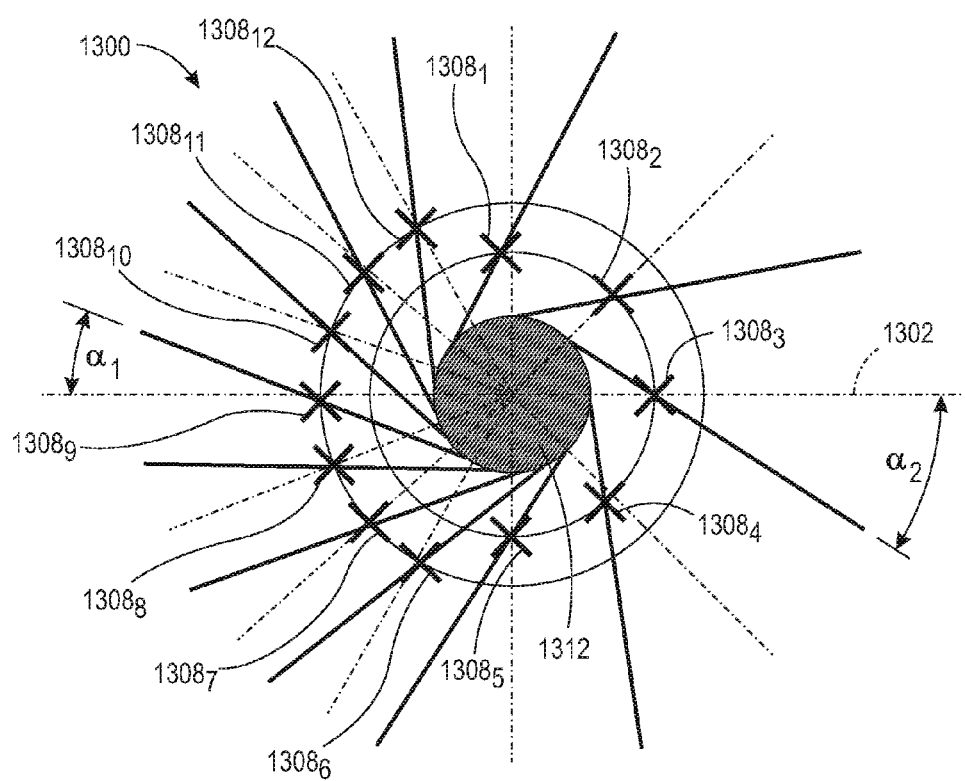
FIG. 13 is a top view another embodiment of a distance sensor that may be used to generate optical configurations of the present disclosure.

Although FIG. 10 accomplishes tilting of the projection beams or planes relative to the central axis by tilting components of the sensor that lie along the central axis relative to the DOEs, this effect can be accomplished using other configurations as well. FIG. 13, for example, is a top view another embodiment of a distance sensor 1300 that may be used to generate optical configurations of the present disclosure. In this case, the layout of the array of second DOEs 1308$_1$-1308$_n$ (hereinafter collectively referred to as "second DOEs 1308") can be configured to project a plurality of projection beams, where at least two of the projection beams are offset from a reference line 1302 extending directing radially outward from the central axis A-A' by different amounts or angles. In one embodiment, this effect is achieved by varying the radial distances of the second DOEs 1308 from the central axis A-A'. For instance, the DOE 1308$_9$ is positioned further away from the lens 1312 of the imaging sensor than the DOE 1308$_3$. As a result, the offset angle α1 between the DOE 1308$_9$ and the reference line 1302 is smaller than the offset angle α2 between the DOE 1308$_3$ and the reference line 1302, as illustrated.

Figure 14A:
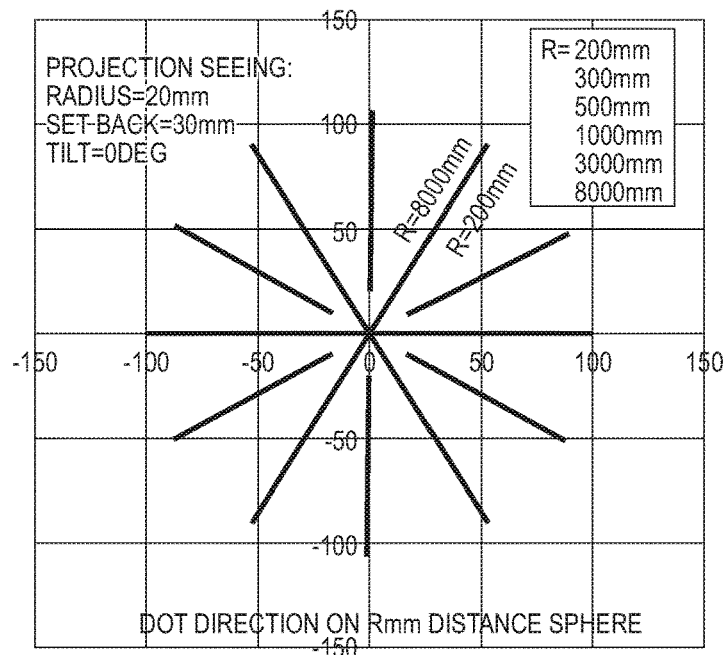
FIGS. 14A-14D illustrate an example projection pattern than can be generated using various different angles of tilt between the projection beams and radial reference lines.
Figure 14B:
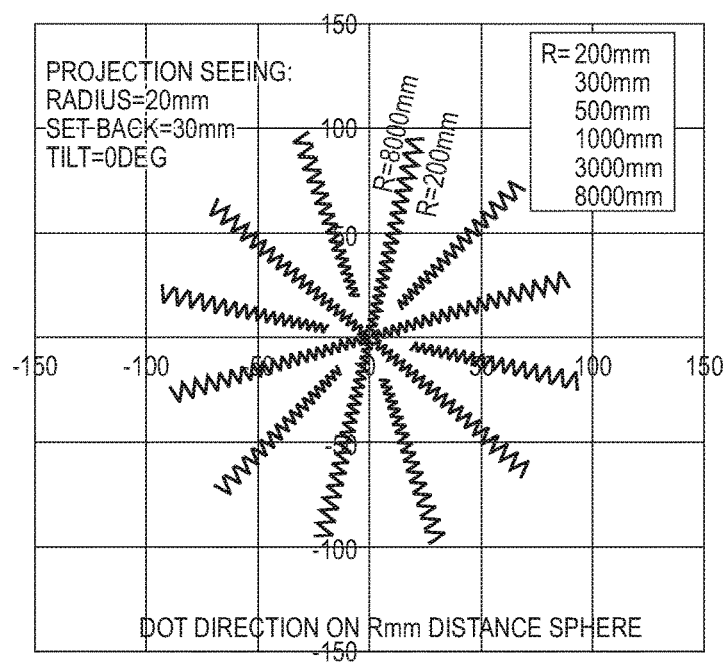
Figure 14C:
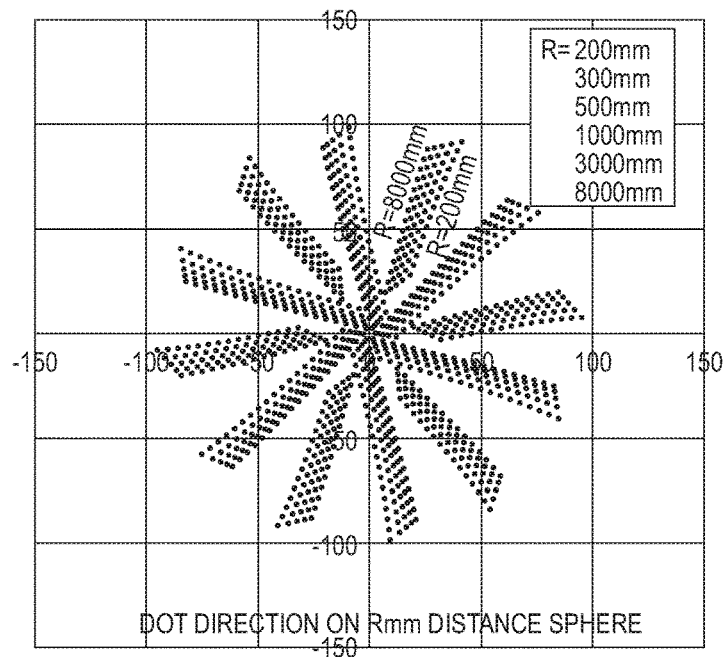
Figure 14D:
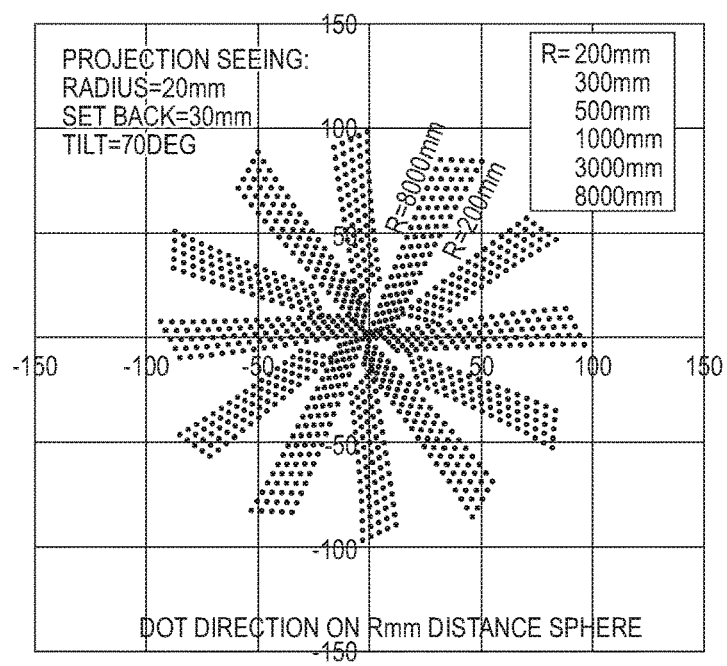

By tilting the projection beams, a projection pattern can be generated that allows one to calculate the distance to an object using non-overlapping projection artifacts (e.g., dots, dashes, or x's) on a single line of projection artifacts. By varying the angle α, the overlap between projection artifacts can be varied. For instance, FIGS. 14A-14D illustrate an example projection pattern than can be generated using various different angles of tilt between the projection beams and radial reference lines. In particular, FIG. 14A illustrates the projection pattern when the angle α is zero degrees; FIG. 14B illustrates the projection pattern when the angle α is twenty degrees; FIG. 14C illustrates the projection pattern when the angle α is forty-five degrees; and FIG. 14D illustrates the projection pattern when the angle α is seventy degrees. As illustrated, larger angles of tilt will result in greater overlap of projection artifacts and a decrease in the line density of multiple projection beams projected by a common DOE.

Figure 19A:
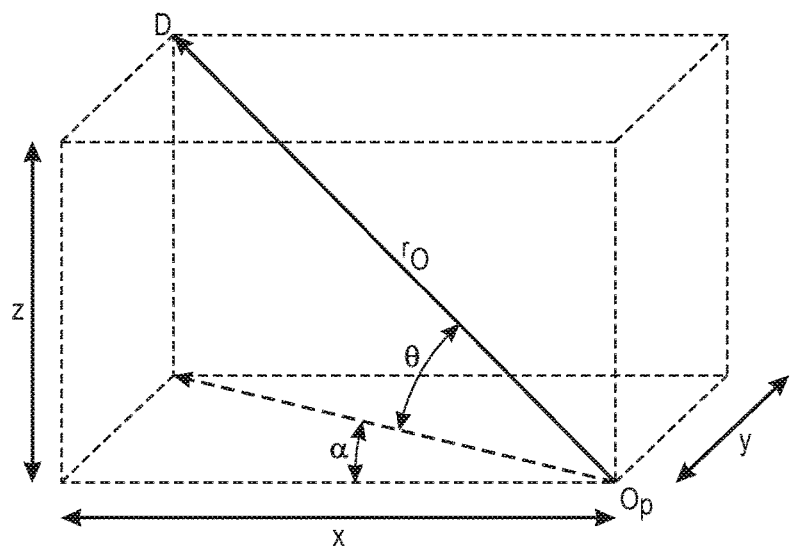
FIGS. 19A and 19B illustrate the concepts from which a simple algorithm for calculating the distance to an object using the sensor of FIGS. 10 and 13 can be derived.
Figure 19B:
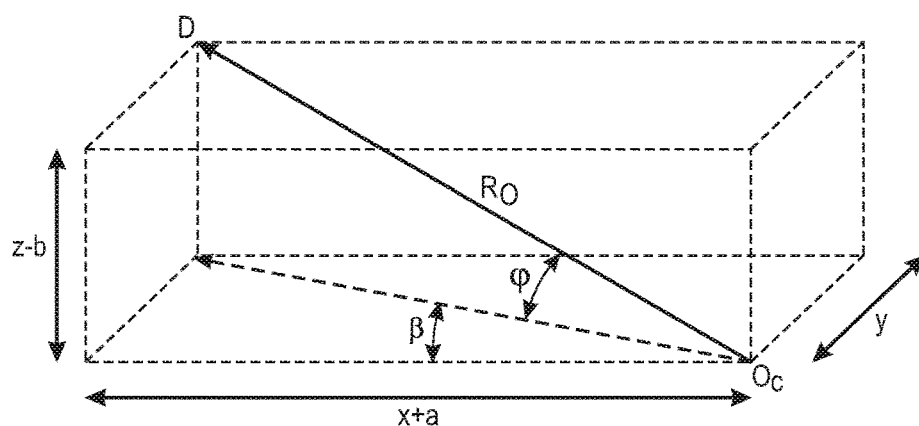

FIGS. 19A and 19B illustrate the concepts from which a simple algorithm for calculating the distance to an object using the sensor of FIGS. 10 and 13 can be derived. Referring to FIG. 19A, the height z, depth y, and length x of the vector $r_0$ from $O_p$ to D can be computed as follows:

$$z = r_0 \sin \theta \qquad \text{(EQN. 4)}$$

$$y = r_0 \cos \theta \sin \alpha \qquad \text{(EQN. 5)}$$

$$x = r_0 \cos \theta \cos \alpha \qquad \text{(EQN. 6)}$$

Thus, $$r_0^2 = x^2 + y^2 + z^2 \qquad \text{(EQN. 7)}$$

EQNs. 4-7 describe the positional relationships of a plurality of parameters of a tilted projection beam emitted by a distance sensor.

Referring to FIG. 19B, when the height is decreased by b and the length is increased by a, the dimensions can be computed as:

$$z - b = R_0 \sin \varphi \qquad \text{(EQN. 8)}$$

$$y = R_0 \cos \varphi \sin \beta \qquad \text{(EQN. 9)}$$

$$x + a = R_0 \cos \varphi \cos \beta \qquad \text{(EQN. 10)}$$

Thus, $$R_0^2 = (x+a)^2 + y^2 + (z-b)^2 \qquad \text{(EQN. 11)}$$

From EQN. 4 and EQN 8, one can derive:

$$R0 \sin \varphi + b = r0 \sin \theta \qquad \text{(EQN. 12)}$$

From EQN. 5 and EQN 9, one can derive:

$$R_0 \cos \varphi \sin \beta = r_0 \cos \theta \sin \alpha \qquad \text{(EQN. 13)}$$

From EQN. 6 and EQN 10, one can derive:

$$R_0 \cos \varphi \cos \beta - a = r_0 \cos \theta \cos \alpha \qquad \text{(EQN. 14)}$$

Thus, $$R_0 = \frac{\alpha \sin \beta + b \cos \theta \cos \alpha}{\cos \varphi \cos \beta \sin \theta - \sin \varphi \cos \theta \cos \alpha} \qquad \text{(EQN. 15)}$$

β and φ are measured from an image captured by the imaging sensor; a, b, and α are known from the imaging sensor/projection settings; and θ is known from the projection pattern.

Figure 20:
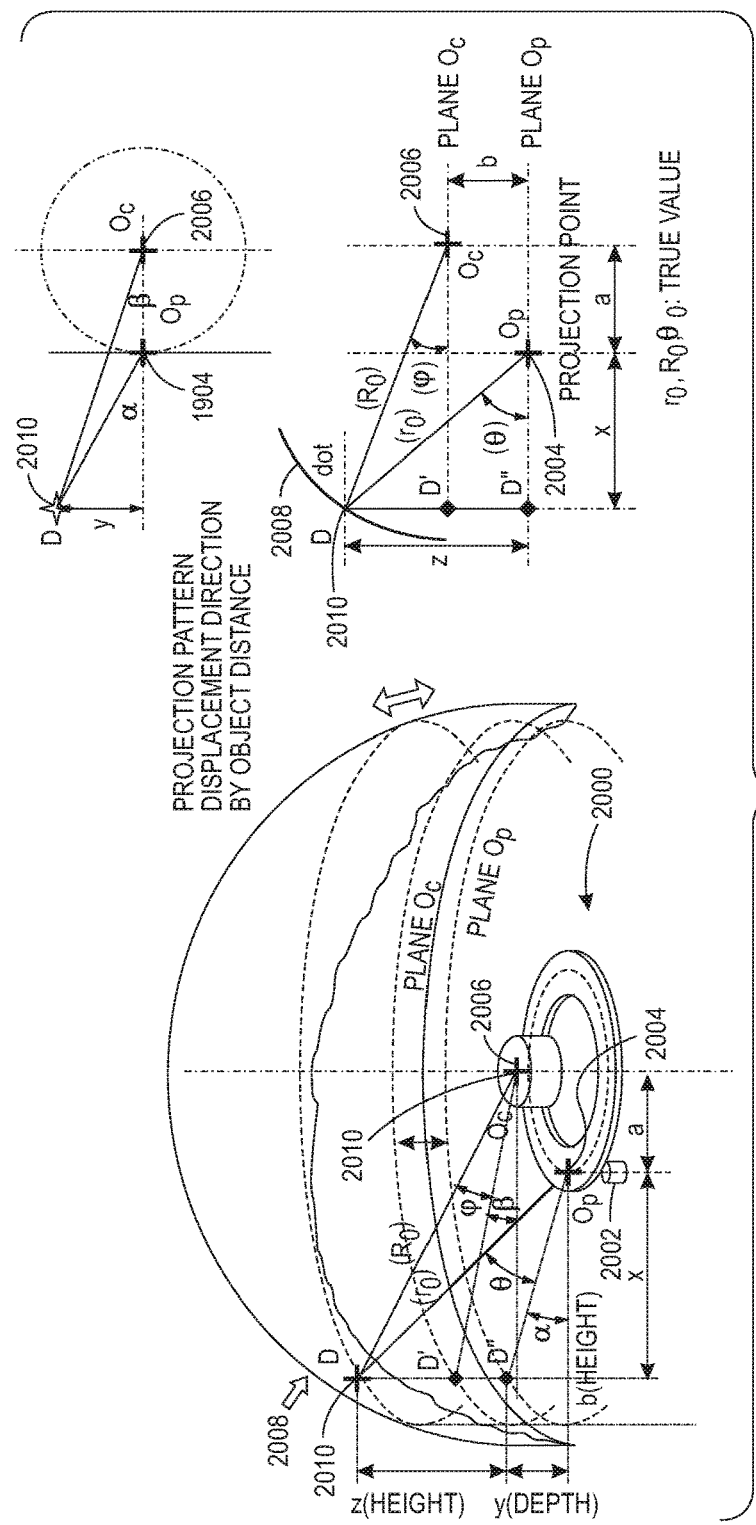
FIG. 20 illustrates the concepts of FIGS. 19A-19B extended to an example distance sensor.

FIG. 20 illustrates the concepts of FIGS. 19A-19B extended to an example distance sensor 2000. The example distance sensor 2000 includes a ring-shaped array of light sources including light source 2002, a projection point, such as projection point 2004, corresponding to each light source (and possibly including a beam splitting means), and an imaging sensor 2006 (including a wide-angle lens). The example distance sensor 2000 is configured to project a pattern of light that forms a virtual sphere 2008.

As illustrated, a projection point of the distance sensor 2000, such as projection point 2006, projects a projection beam onto an object 2010 positioned a distance D away from the imaging sensor 2006. An angle of the projection beam relative to an axis B-B' extending radially outward from the central axis is defined by a. A portion of the light emitted by the projection beam is reflected back to the imaging sensor 2006 as a beam of return light.

Figure 15:
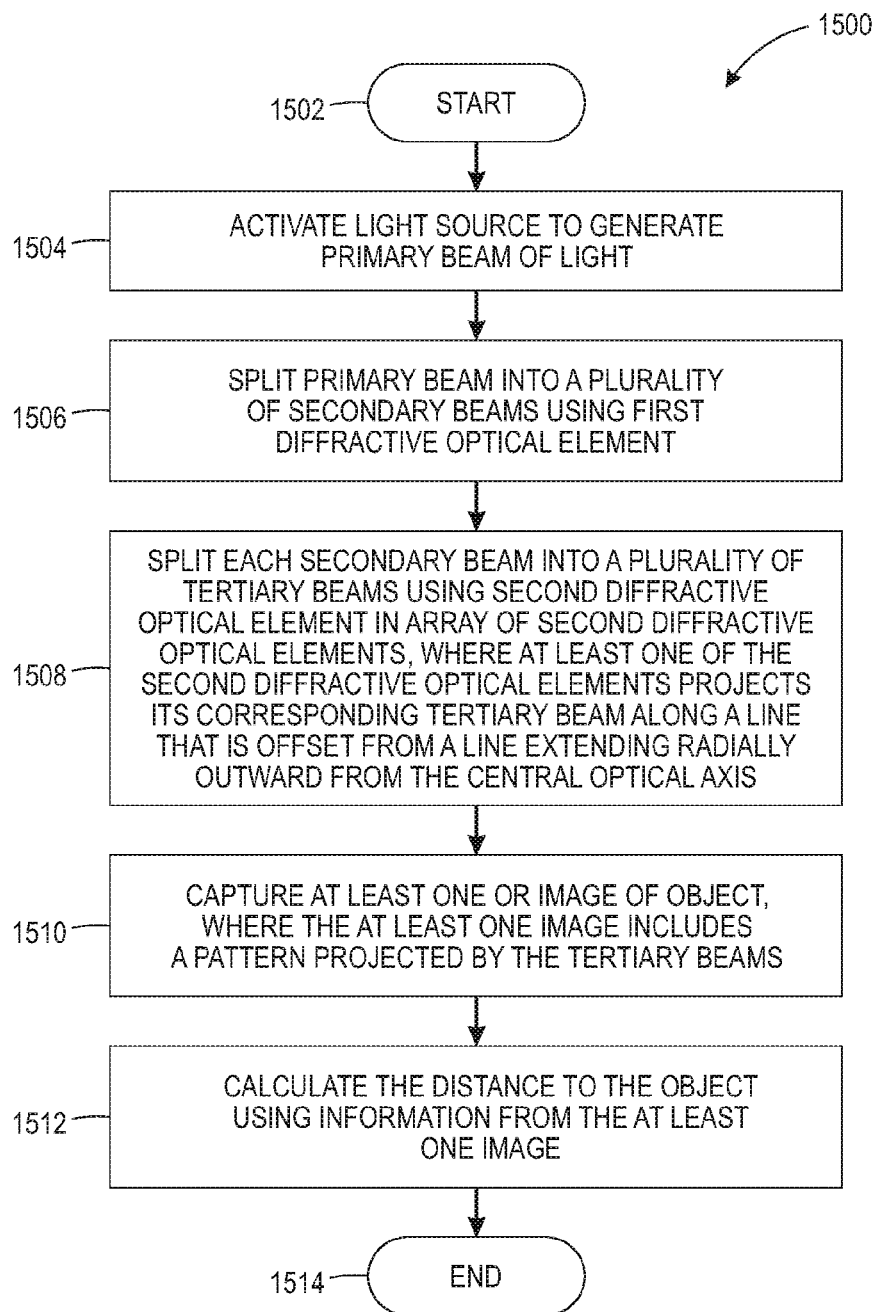
FIG. 15 illustrates a flowchart of a method 1500 for calculating the distance from a sensor to an object or point in space.

FIG. 15 illustrates a flowchart of a method 1500 for calculating the distance from a sensor to an object or point in space. In one embodiment, the method 1500 may be performed by a processor integrated in an imaging sensor (such as the imaging sensor 110 illustrated in FIGS. 1A-1B and 10) or a general purpose computing device as illustrated in FIG. 16 and discussed below.

The method 1500 begins in step 1502. In step 1504, a light source is activated to generate a primary beam of light. In one embodiment, a single primary beam is generated by a single light source; however, in other embodiments, multiple primary beams are generated by multiple light sources. In one embodiment, the light source or light sources comprise a laser light source.

In optional step 1506, the primary beam is split into a plurality of secondary beams using a first beam splitting means (e.g., a diffractive optical element) that is positioned in the path along which the primary beam propagates. The first beam splitting means may be, for example, a conical mirror. Step 806 is performed, for example, when the distance sensor (of which the imaging sensor is a part) includes only a single light source.

In step 1508, each beam in the plurality of secondary beams is split into a plurality of projection or tertiary beams using a second beam splitting means (e.g., second diffractive optical element) in an array of beam splitting means. In one embodiment, a plurality of second beam splitting means are positioned in a ring, such that each second beam splitting means is positioned in the path along which one of the secondary beams propagates. In one embodiment, at least some of the second beam splitting means are conical mirrors. In one embodiment, where the distance sensor comprises a plurality of light sources, the method 800 may proceed directly from step 1504 to step 1508. In this case, each primary beam of a plurality of primary beams (generated using the plurality of light sources) is directly split into a plurality of projection beams by one of the second beam splitting means.

In step 1510, at least one image of the object or point is captured. The image includes a pattern that is projected onto the object or point and onto the surrounding space. The pattern is created by each of the projection beams projecting a series of dots, lines, or other shapes onto the object, point, or surrounding space. In one example, the pattern comprises one or more projection beams that are offset or tilted relative to an imaginary reference line extending radially outward from the sensor's central axis A'A', for example as illustrated in FIGS. 10-14D.

In step 1512, the distance from the sensor to the object or point is calculated using information from the images captured in step 1510. In one embodiment, a triangulation technique such as that discussed above in connection with FIG. 9 is used to calculate the distance. For example, the positional relationships between parts of the patterns projected by the sensor can be used as the basis for the calculation.

The method 1500 ends in step 1514. Thus, the method 1500, in combination with the sensor depicted in FIG. 1A-1B or 10 or with a sensor having similar capabilities, can measure the distance from the sensor to an object or point in space in a single cycle of image capture and calculation.

FIG. 16 depicts a high-level block diagram of a general-purpose computer suitable for use in performing the functions described herein. As depicted in FIG. 16, the system 1600 comprises one or more hardware processor elements 1602 (e.g., a central processing unit (CPU), a microprocessor, or a multi-core processor), a memory 1604, e.g., random access memory (RAM) and/or read only memory (ROM), a module 1605 for calculating distance, and various input/output devices 1606 (e.g., storage devices, including but not limited to, a tape drive, a floppy drive, a hard disk drive or a compact disk drive, a receiver, a transmitter, a lens and optics, an output port, an input port and a user input device (such as a keyboard, a keypad, a mouse, a microphone and the like)). Although only one processor element is shown, it should be noted that the general-purpose computer may employ a plurality of processor elements. Furthermore, although only one general-purpose computer is shown in the figure, if the method(s) as discussed above is implemented in a distributed or parallel manner for a particular illustrative example, i.e., the steps of the above method(s) or the entire method(s) are implemented across multiple or parallel general-purpose computers, then the general-purpose computer of this figure is intended to represent each of those multiple general-purpose computers. Furthermore, one or more hardware processors can be utilized in supporting a virtualized or shared computing environment. The virtualized computing environment may support one or more virtual machines representing computers, servers, or other computing devices. In such virtualized virtual machines, hardware components such as hardware processors and computer-readable storage devices may be virtualized or logically represented.

It should be noted that the present disclosure can be implemented in software and/or in a combination of software and hardware, e.g., using application specific integrated circuits (ASIC), a programmable logic array (PLA), including a field-programmable gate array (FPGA), or a state machine deployed on a hardware device, a general purpose computer or any other hardware equivalents, e.g., computer readable instructions pertaining to the method(s) discussed above can be used to configure a hardware processor to perform the steps, functions and/or operations of the above disclosed methods. In one embodiment, instructions and data for the present module or process 1605 for calculating distance (e.g., a software program comprising computer-executable instructions) can be loaded into memory 1604 and executed by hardware processor element 1602 to implement the steps, functions or operations as discussed above in connection with the example methods 800 and 1500. Furthermore, when a hardware processor executes instructions to perform "operations", this could include the hardware processor performing the operations directly and/or facilitating, directing, or cooperating with another hardware device or component (e.g., a co-processor and the like) to perform the operations.

The processor executing the computer readable or software instructions relating to the above described method(s) can be perceived as a programmed processor or a specialized processor. As such, the present module 1605 for calculating distance (including associated data structures) of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. More specifically, the computer-readable storage device may comprise any physical devices that provide the ability to store information such as data and/or instructions to be accessed by a processor or a computing device such as a computer or an application server.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for calculating a distance to an object, the method comprising:
   projecting a plurality of projection beams from each of a plurality of projection points, wherein the plurality of projection points is arranged around a lens of an image capturing device, wherein each beam of the plurality of projection beams projects a projection pattern of individual projection artifacts into a field of view of the image capturing device, and wherein at least two beams of the plurality of projection beams are parallel to each other;
   capturing an image of the field of view, wherein the object is visible in the image and a collective projection pattern generated by the projection patterns projected by the at least two beams is also visible in the image; and
   calculating the distance to the object using information in the image.

2. The method of claim 1, wherein the at least two beams of the plurality of projection beams are projected from different projection points of the plurality of projection points.

3. The method of claim 1, wherein each beam of the at least two beams of the plurality of projection beams is part of a separate projection plane.

4. The method of claim 3, wherein the projection plane is projected from a single projection point of the plurality of projection points, and the projection plane spans ninety degrees.

5. The method of claim 3, wherein the projection plane is projected from two projection points of the plurality of projection points, and the projection plane spans 180 degrees.

6. The method of claim 3, wherein the projection plane is projected from four projection points of the plurality of projection points, and the projection plane spans 360 degrees.

7. The method of claim 3, wherein the projection plane is parallel to a central optical axis of the image capturing device.

8. The method of claim 1, wherein the at least two beams of the plurality of projection beams are offset by an angle relative to a line extending radially outward from an axis passing through a center of the lens, such that the at least two beams.

9. A computer-readable storage device storing a plurality of instructions which, when executed by a processor, cause the processor to perform operations for calculating a distance to an object, the operations comprising:
   projecting a plurality of projection beams from each of a plurality of projection points, wherein the plurality of projection points is arranged around a lens of an image capturing device, wherein each beam of the plurality of projection beams projects a projection pattern of individual projection artifacts into a field of view of the image capturing device, and wherein at least two beams of the plurality of projection beams are parallel to each other;
   capturing an image of the field of view, wherein the object is visible in the image and a collective projection pattern generated by the projection patterns projected by the at least two beams is also visible in the image; and
   calculating the distance to the object using information in the image.

10. A method for calculating a distance to an object, the method comprising:
    simultaneously projecting a first plurality of projection beams from a first projection point of a plurality of projection points, wherein the plurality of projection points is arranged around a lens of an image capturing device, wherein each beam of the first plurality of projection beams projects a projection pattern of individual projection artifacts into a field of view of the image capturing device, and wherein a first beam of the first plurality of projection beams is offset by a first angle relative to a line extending radially outward from an axis passing through a center of the lens;
    capturing an image of the field of view, wherein the object is visible in the image and a collective projection pattern generated by projection patterns projected by the first plurality of projection beams, including the first beam, is also visible in the image; and
    calculating the distance to the object using information in the image.

11. The method of claim 10, wherein multiple beams of the first plurality of projection beams are offset by the first angle relative to the line extending radially outward from the axis passing through the center of the lens.

12. The method of claim 10, wherein a second plurality of projection beams is projected from a second projection point of the plurality of projection points, simultaneously with the first plurality of projection beams, a first beam of the second plurality of projection beams is offset by a second angle relative to the line extending radially outward from the axis passing through the center of the lens, and the second angle is greater than the first angle.

13. The method of claim 12, wherein the projecting comprises:
    tilting the image capturing device relative to the plurality of projection points.

14. The method of claim 12, wherein the projecting comprises:
    spacing the plurality of projection points different radial distances from the center of the lens.

15. The method of claim 10, wherein the first beam of the first plurality of projection beams is orientated parallel to a second beam of a second plurality of projection beams that is projected by a second projection point of the plurality of projection points.

16. The method of claim 10, wherein the first angle is twenty degrees.

17. The method of claim 10, wherein the first angle is forty-five degrees.

18. The method of claim 10, wherein the first angle is seventy degrees.

19. The method of claim 1, wherein the visible pattern of individual projection artifacts comprises a visible pattern of individual shapes projected onto the field of view.

* * * * *